United States Patent
Zahorik

(10) Patent No.: US 8,264,061 B2
(45) Date of Patent: Sep. 11, 2012

(54) PHASE CHANGE MEMORY CELL AND DEVICES CONTAINING SAME

(75) Inventor: Russell C. Zahorik, Boise, ID (US)

(73) Assignee: Round Rock Research, LLC, Mt. Kisco, NY (US)

( * ) Notice: Subject to any disclaimer, the term of this patent is extended or adjusted under 35 U.S.C. 154(b) by 94 days.

(21) Appl. No.: 12/917,920

(22) Filed: Nov. 2, 2010

(65) Prior Publication Data

US 2011/0042640 A1 Feb. 24, 2011

Related U.S. Application Data

(60) Continuation of application No. 12/711,818, filed on Feb. 24, 2010, now Pat. No. 7,838,416, which is a continuation of application No. 12/357,222, filed on Jan. 21, 2009, now Pat. No. 7,687,881, which is a division of application No. 11/861,202, filed on Sep. 25, 2007, now Pat. No. 7,494,922, which is a continuation of application No. 10/931,196, filed on Aug. 31, 2004, now Pat. No. 7,273,809, which is a continuation of application No. 10/384,267, filed on Mar. 7, 2003, now Pat. No. 6,797,612, which is a division of application No. 09/900,725, filed on Jul. 6, 2001, now Pat. No. 6,531,391, which is a division of application No. 08/684,815, filed on Jul. 22, 1996, now Pat. No. 6,337,266.

(51) Int. Cl.
*H01L 45/00* (2006.01)
(52) U.S. Cl. .................. 257/529; 257/537; 257/E45.002
(58) Field of Classification Search .................... 438/95
See application file for complete search history.

(56) References Cited

U.S. PATENT DOCUMENTS

| 3,241,009 A | 3/1966 | Dewald et al. |
| 3,423,646 A | 1/1969 | Cubert et al. |
| 3,602,635 A | 8/1971 | Romankiw |
| 3,699,543 A | 10/1972 | Neale |
| 3,796,926 A | 3/1974 | Cole et al. |
| 3,877,049 A | 4/1975 | Buckley |
| 3,886,577 A | 5/1975 | Buckley |
| 4,099,260 A | 7/1978 | Lynes et al. |

(Continued)

FOREIGN PATENT DOCUMENTS

EP 0117045 A2 8/1984

(Continued)

OTHER PUBLICATIONS

Kim and Kim, "Effects of High-Current Pulses on Polycrystalline Silicon Diode with n-type Region Heavily Doped with Both Boron andPhosphorus," J. Appl. Phys., 53(7):5359-5360, Jul. 1982.

(Continued)

*Primary Examiner* — Stephen W Smoot
(74) *Attorney, Agent, or Firm* — Lerner, David, Littenberg, Krumholz & Mentlik, LLP

(57) ABSTRACT

A device with a memory array is disclosed. In one embodiment, the memory array includes a plurality of memory cells, each including an electrode and a phase change material. The electrode may be disposed on a substrate, the electrode having a sublithographic lateral dimension parallel to the substrate. The phase change material may be coupled to the electrode and include a lateral dimension parallel to the substrate and greater than the sublithographic lateral dimension of the electrode.

26 Claims, 19 Drawing Sheets

U.S. PATENT DOCUMENTS

| | | | |
|---|---|---|---|
| 4,115,872 A | 9/1978 | Bluhm |
| 4,174,521 A | 11/1979 | Neale |
| 4,194,283 A | 3/1980 | Hoffmann |
| 4,203,123 A | 5/1980 | Shanks |
| 4,227,297 A | 10/1980 | Angerstein |
| 4,272,562 A | 6/1981 | Wood |
| 4,420,766 A | 12/1983 | Kasten |
| 4,433,342 A | 2/1984 | Patel et al. |
| 4,458,260 A | 7/1984 | McIntyre et al. |
| 4,499,557 A | 2/1985 | Holmberg et al. |
| 4,502,208 A | 3/1985 | McPherson |
| 4,502,914 A | 3/1985 | Trumpp et al. |
| 4,569,698 A | 2/1986 | Feist |
| 4,630,355 A | 12/1986 | Johnson |
| 4,641,420 A | 2/1987 | Lee |
| 4,642,140 A | 2/1987 | Noufi et al. |
| 4,666,252 A | 5/1987 | Yaniv et al. |
| 4,677,742 A | 7/1987 | Johnson |
| 4,757,359 A | 7/1988 | Chiao et al. |
| 4,795,657 A | 1/1989 | Formigoni et al. |
| 4,804,490 A | 2/1989 | Pryor et al. |
| 4,809,044 A | 2/1989 | Pryor et al. |
| 4,823,181 A | 4/1989 | Mohsen et al. |
| 4,876,220 A | 10/1989 | Mohsen et al. |
| 4,876,668 A | 10/1989 | Thakoor et al. |
| 4,881,114 A | 11/1989 | Mohsen et al. |
| 4,892,840 A | 1/1990 | Esquivel et al. |
| 4,956,312 A | 9/1990 | Van Laarhoven |
| 5,144,404 A | 9/1992 | Iranmanesh et al. |
| 5,166,096 A | 11/1992 | Cote et al. |
| 5,166,758 A | 11/1992 | Ovshinsky et al. |
| 5,177,567 A | 1/1993 | Klersy et al. |
| 5,216,282 A | 6/1993 | Cote et al. |
| 5,223,448 A | 6/1993 | Su |
| 5,233,217 A | 8/1993 | Dixit et al. |
| 5,278,099 A | 1/1994 | Maeda |
| 5,293,335 A | 3/1994 | Pernisz et al. |
| 5,296,716 A | 3/1994 | Ovshinsky et al. |
| 5,310,693 A | 5/1994 | Hsue |
| 5,335,219 A | 8/1994 | Ovshinsky et al. |
| 5,341,328 A | 8/1994 | Ovshinsky et al. |
| 5,359,205 A | 10/1994 | Ovshinsky |
| 5,363,329 A | 11/1994 | Troyan |
| 5,406,125 A | 4/1995 | Johnson et al. |
| 5,414,221 A | 5/1995 | Gardner |
| 5,414,271 A | 5/1995 | Ovshinsky et al. |
| 5,429,988 A | 7/1995 | Huang et al. |
| 5,466,637 A | 11/1995 | Kim |
| 5,500,080 A | 3/1996 | Choi |
| 5,510,629 A | 4/1996 | Karpovich et al. |
| 5,529,956 A | 6/1996 | Morishita |
| 5,534,711 A | 7/1996 | Ovshinsky et al. |
| 5,534,712 A | 7/1996 | Ovshinsky et al. |
| 5,536,947 A | 7/1996 | Klersy et al. |
| 5,569,932 A | 10/1996 | Shor et al. |
| 5,578,185 A | 11/1996 | Bergeron et al. |
| 5,614,765 A | 3/1997 | Avanzino et al. |
| 5,648,298 A | 7/1997 | Cho |
| 5,665,625 A | 9/1997 | Sandhu et al. |
| 5,675,187 A | 10/1997 | Numata et al. |
| 5,677,242 A | 10/1997 | Aisou |
| 5,687,112 A | 11/1997 | Ovshinsky |
| 5,705,430 A | 1/1998 | Avanzino et al. |
| 5,714,768 A | 2/1998 | Ovshinsky et al. |
| 5,714,795 A | 2/1998 | Ohmi et al. |
| 5,719,089 A | 2/1998 | Cherng et al. |
| 5,728,596 A | 3/1998 | Prall |
| 5,751,012 A | 5/1998 | Wolstenholme et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,841,150 A | 11/1998 | Gonzalez et al. |
| 5,847,460 A | 12/1998 | Liou et al. |
| 5,869,843 A | 2/1999 | Harshfield |
| 5,874,359 A | 2/1999 | Liaw et al. |
| 5,920,788 A | 7/1999 | Reinberg |
| 6,077,729 A | 6/2000 | Harshfield |
| 6,111,319 A | 8/2000 | Liou et al. |
| 6,117,720 A | 9/2000 | Harshfield |
| 6,337,266 B1 | 1/2002 | Zahorik |
| 6,420,725 B1 | 7/2002 | Harshfield |
| 6,531,391 B2 | 3/2003 | Zahorik |
| 6,635,951 B1 | 10/2003 | Zahorik |
| 6,797,612 B2 | 9/2004 | Zahorik |
| 7,273,809 B2 | 9/2007 | Zahorik |
| 7,494,922 B2 | 2/2009 | Zahorik |
| 7,687,881 B2 * | 3/2010 | Zahorik ............... 257/529 |

FOREIGN PATENT DOCUMENTS

| | | |
|---|---|---|
| GB | 1319388 A | 6/1973 |
| JP | 60109266 A | 6/1985 |
| JP | 4045585 A | 2/1992 |

OTHER PUBLICATIONS

Neale and Aseltine, "The Application of Amorphous Materials to Computer Memories," IEEE Transactions on Election Devices, 20(2):195-205, Feb. 1973.

Pein and Plummer, "Performance of the 3-D Sidewall Flash EPROM Cell," International Electron Devices Meeting Dec. 11-14, 1993.

Post and Ashburn, "Investigation of Boron Diffusion in Polysilicon and its Application to the Design of p-n-p Polysilicon Emitter Bipolar Transistors with Shallow Emitter Junctions," IEEE Transactions on Electron Devices, 38 (11):2442-2451, Nov. 1991.

Post et al., "Polysilicon Emitters for Bipolar Transistors: A Review and Re-Evaluation of Theory and Experiment," IEEE Transactions on Electron Devices, 39(7):1717-1731, Jul. 1992.

Post and Ashburn, "The Use of an Interface Anneal to Control the Base Current and Emitter Resistance of p-n-p Polysilicon Emitter Bipolar Transistors," IEEE Electron Device Letters, 13(8):408-410, Aug. 1992.

Rose et al., "Amorphous Silicon Analogue Memory Devices," J. Non-Crystalline Solids, 115:168-170, 1989.

Schaber et al., "Laser Annealing Study of the Grain Size Effect in Polycrystalline Silicon Schottky Diodes," J. Appl. Phys., 53(12):8827-8834, Dec. 1982.

Yamamoto et al., "The I-V Characteristics of Polycrystalline Silicon Diodes and the Energy Distribution of Traps in Grain Boundaries," Electronics and Communications in Japan, Part 2, 75(7):51-58, 1992.

Yeh et al., "Investigation of Thermal Coefficient for Polycrystalline Silicon Thermal Sensor Diode," Jpn. J. Appl. Phys., 31(Part 1, No. 2A):151-155, Feb. 1992.

Oakley et al., "Pillars—The Way to Two Micron Pitch Multilevel Metallisation," IEEE, 23-29, 1984.

Prince, "Semiconductor Memories," A Handbook of Design, Manufacture, and Application, 2.sup.nd Ed., Wiley, pp. 118-123, 1991.

* cited by examiner

PHASE CHANGE MEMORY CELL AND DEVICES CONTAINING SAME

CROSS-REFERENCE TO RELATED APPLICATIONS

This application is a continuation of U.S. application Ser. No. 12/711,818, filed Feb. 24, 2010 and issued on Nov. 3, 2010 as U.S. Pat. No. 7,838,416, which is a continuation of U.S. application Ser. No. 12/357,222, filed Jan. 21, 2009 and issued on Mar. 30, 2010 as U.S. Pat. No. 7,687,881, which is a divisional of U.S. application Ser. No. 11/861,202, filed Sep. 25, 2007, and issued on Feb. 24, 2009 as U.S. Pat. No. 7,494,922, which is a continuation of U.S. application Ser. No. 10/931,196, filed Aug. 31, 2004, and issued on Sep. 25, 2007 as U.S. Pat. No. 7,273,809, which is a continuation of U.S. patent application Ser. No. 10/384,267, filed Mar. 7, 2003, and issued on Sep. 28, 2004, as U.S. Pat. No. 6,797,612, which is a divisional of U.S. patent application Ser. No. 09/900,725, filed Jul. 6, 2001, and issued on Mar. 11, 2003, as U.S. Pat. No. 6,531,391, which is a divisional of U.S. application Ser. No. 08/684,815, filed Jul. 22, 1996, and issued on Jan. 8, 2002, as U.S. Pat. No. 6,337,266, the disclosures of which are hereby incorporated herein by reference.

BACKGROUND OF THE INVENTION

The present invention relates generally to chalcogenide memory devices and, more particularly, to a chalcogenide memory device having an ultra-small electrode, thus providing for fabrication of a denser memory array and reducing the amount of energy required to adjust the crystalline state of the chalcogenide material.

The use of electrically writable and erasable phase change materials (i.e., materials which can be electrically switched between generally amorphous and generally crystalline states or between different resistive states while in crystalline form) for electronic memory applications is known in the art and is disclosed, for example, in U.S. Pat. No. 5,296,716 to Ovshinsky et al., the disclosure of which is incorporated herein by reference. U.S. Pat. No. 5,296,716 is believed to indicate generally the state of the art, and to contain a discussion of the current theory of operation of chalcogenide materials.

Generally, as disclosed in the aforementioned Ovshinsky patent, such phase change materials can be electrically switched between a first structural state where the material is generally amorphous and a second structural state where the material has a generally crystalline local order. The material may also be electrically switched between different detectable states of local order across the entire spectrum between the completely amorphous and the completely crystalline states. That is, the switching of such materials is not required to take place between completely amorphous and completely crystalline states but rather the material can be switched in incremental steps reflecting changes of local order to provide a "gray scale" represented by a multiplicity of conditions of local order spanning the spectrum from the completely amorphous state to the completely crystalline state.

The material exhibits different electrical characteristics depending upon its state. For instance, in its amorphous state the material exhibits a lower electrical conductivity than it does in its crystalline state.

These memory cells are monolithic, homogeneous, and formed of chalcogenide material selected from the group of Te, Se, Sb, Ni, and Ge. Such chalcogenide materials can be switched between numerous electrically detectable conditions of varying resistivity in nanosecond time periods with the input of picojoules of energy. The resulting memory material is truly non-volatile and will maintain the integrity of the information stored by the memory cell without the need for periodic refresh signals. Furthermore, the data integrity of the information stored by these memory cells is not lost when power is removed from the device. The subject memory material is directly overwritable so that the memory cells need not be erased (set to a specified starting point) in order to change information stored within the memory cells. Finally, the large dynamic range offered by the memory material provides for the gray scale storage of multiple bits of binary information in a single cell by mimicking the binary encoded information in analog form and thereby storing multiple bits of binary encoded information as a single resistance value in a single cell.

The operation of chalcogenide memory cells requires that a region of the chalcogenide memory material, called the chalcogenide active region, be subjected to a current pulse typically with a current density between about $10^5$ and $10^7$ amperes/cm$^2$, to change the crystalline state of the chalcogenide material within the active region contained within a small pore. This current density may be accomplished by first creating a small opening in a dielectric material which is itself deposited onto a lower electrode material. A second dielectric layer, typically of silicon nitride, is then deposited onto the dielectric layer and into the opening. The second dielectric layer is typically on the order of 40 Angstroms thick. The chalcogenide material is then deposited over the second dielectric material and into the opening. An upper electrode material is then deposited over the chalcogenide material. Carbon is a commonly used electrode material, although other materials have also been used, for example, molybdenum and titanium nitride. A conductive path is then provided from the chalcogenide material to the lower electrode material by forming a pore in the second dielectric layer by the well known process of firing. Firing involves passing an initial high current pulse through the structure which passes through the chalcogenide material and then provides dielectric breakdown of the second dielectric layer, thereby providing a conductive path via the pore through the memory cell.

Electrically firing the thin silicon nitride layer is not desirable for a high density memory product due to the high current required and the large amount of testing time that is required for the firing.

The active regions of the chalcogenide memory cells within the pores are believed to change crystalline structure in response to applied voltage pulses of a wide range of magnitudes and pulse durations. These changes in crystalline structure alter the bulk resistance of the chalcogenide active region. The wide dynamic range of these devices, the linearity of their response, and lack of hysteresis provide these memory cells with multiple bit storage capabilities.

Factors such as pore dimensions (diameter, thickness, and volume), chalcogenide composition, signal pulse duration and signal pulse waveform shape have an effect on the magnitude of the dynamic range of resistances, the absolute endpoint resistances of the dynamic range, and the currents required to set the memory cells at these resistances. For example, relatively large pore diameters (e.g., about 1 micron) will result in higher programming current requirements, while relatively small pore diameters (e.g., about 500 Angstroms) will result in lower programming current requirements. The most important factor in reducing the required programming current is the pore cross sectional area.

The energy input required to adjust the crystalline state of the chalcogenide active region of the memory cell is directly proportional to the dimensions of the minimum lateral dimension of the pore (e.g., smaller pore sizes result in smaller energy input requirement). Conventional chalcogenide memory cell fabrication techniques provide a minimum lateral pore dimension, diameter or width of the pore, that is limited by the photolithographic size limit. This results in pore sizes having minimum lateral dimensions down to approximately 0.35 micron.

The present invention is directed to overcoming, or at least reducing the affects of, one or more of the problems set forth above. In particular, the present invention provides a method for fabricating electrodes for chalcogenide memory cells with minimum lateral dimensions below the photolithographic limit thereby reducing the required energy input to the chalcogenide active region in operation. The ultra-small electrodes are further selected to provide material properties which permit enhanced control of the current passing through the chalcogenide memory cell. As a result, the memory cells may be made smaller to provide denser memory arrays, and the overall power requirements for the memory cell are minimized.

DESCRIPTION OF THE DRAWINGS

The present invention will become more fully understood from the following detailed description of the preferred embodiments, taken in conjunction with the accompanying drawings in which.

DETAILED DESCRIPTION OF EXEMPLARY EMBODIMENTS

A method of fabricating ultra-small electrodes for chalcogenide memories is presented that provides electrode sizes smaller than that presently provided using conventional photolithographic methods. In particular, the preferred embodiment of the present invention provides a method of fabricating electrodes for chalcogenide memories that relies upon disposable spacers to define the minimum lateral dimension of a pore into which the electrode is positioned. In this manner, electrodes having minimum lateral dimensions as small as around 500 Angstroms are obtained. The present preferred embodiment further provides enhanced control of the current passing through the resulting chalcogenide memory by use of metal organic materials as the selected material for the ultra-small electrodes.

Figure 1:
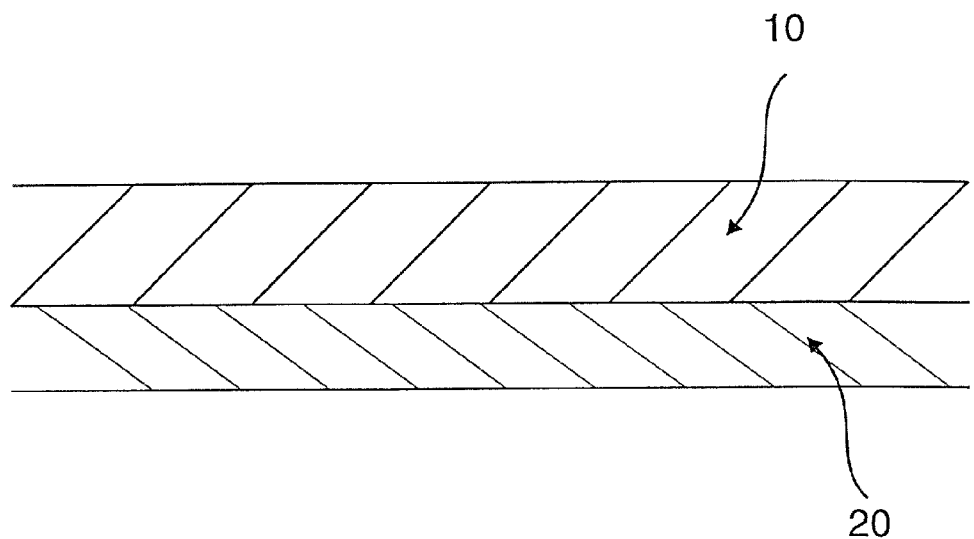
FIG. 1 is a fragmentary cross sectional view of the deposition of a layer of tetraethylorthosilicate (TEOS) oxide onto a substrate of titanium nitride in accordance with a first preferred embodiment of the present invention.

Turning to the drawings and referring initially to FIGS. 1 to 10, a first preferred embodiment of a method for fabricating ultra-small electrodes for chalcogenide memories will now be described. A layer 10 of tetraethylorthosilicate (TEOS) oxide is first deposited onto a substrate 20 of titanium nitride using convention thin film deposition techniques as shown in FIG. 1. The layer 10 may have a substantially uniform thickness ranging from about 200 to 5000 Angstroms, and preferably it will have a substantially uniform thickness of approximately 200 Angstroms. The layer 10 may be comprised of TEOS oxide or plasma enhanced chemical vapor deposition (PECVD) of $SiO_2$, and preferably will be comprised of TEOS oxide. The substrate 20 may be comprised of a conductive material such as, for example, TiN, Carbon, $WiSi_x$, or Tungsten, and preferably will be comprised of TiN. The substrate will further preferably comprise a lower electrode grid used for accessing an array of chalcogenide memories.

Figure 2:
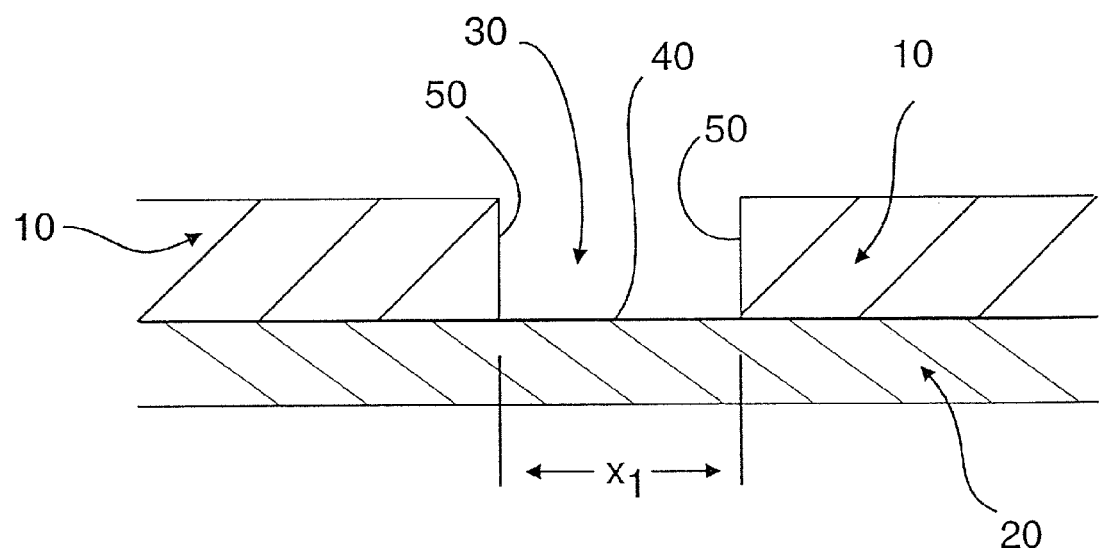
FIG. 2 is a fragmentary cross sectional view of the formation of an opening in the layer of TEOS oxide of FIG. 1.
Figure 2A:
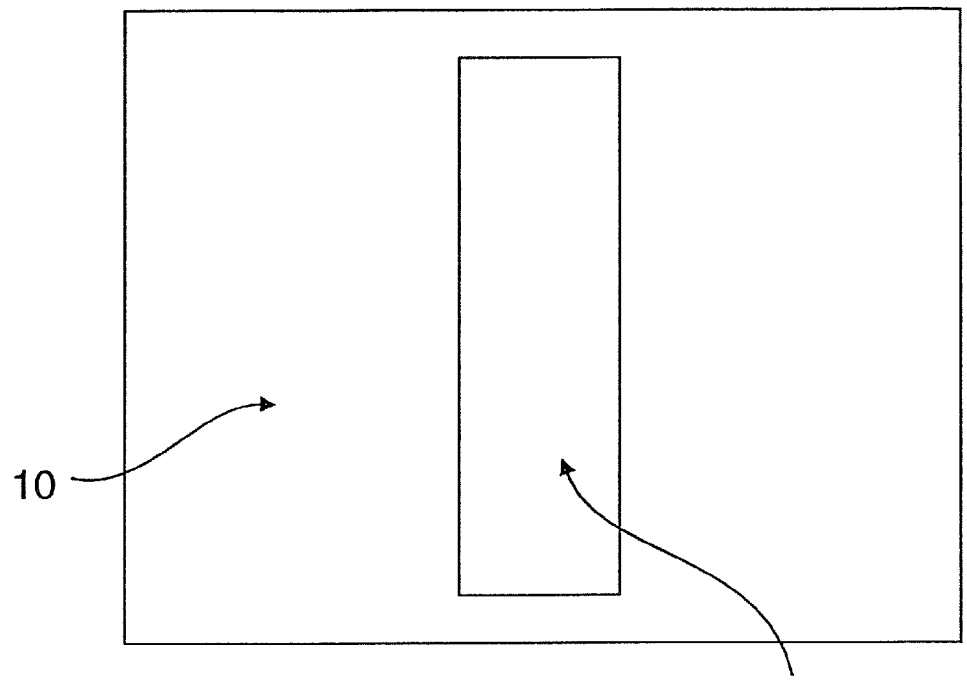
FIG. 2a is an overhead view of a generally rectangular opening formed in the layer of TEOS oxide of FIG. 1.
Figure 2B:
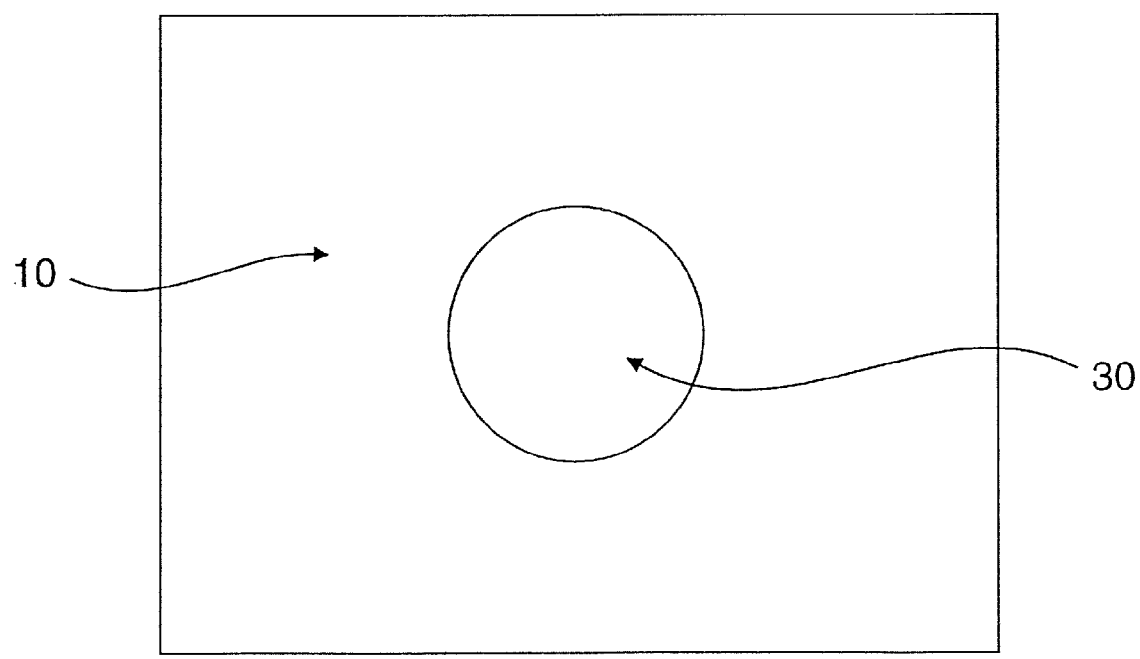
FIG. 2b is an overhead view of a generally circular opening formed in the layer of TEOS oxide of FIG. 1.

An opening 30, extending to the layer 20, is then etched in the layer 10 using conventional anisotropic etching and masking techniques as shown in FIG. 2. The opening 30 may be formed, for example, as a generally rectangular channel as shown in FIG. 2a, or as a substantially circular opening in the layer 10 as shown in FIG. 2b. The opening 30 is preferably formed using a conventional contact hole mask resulting in the substantially circular opening shown in FIG. 2b. The minimum lateral dimension $x_1$ of the opening 30 may range from about 2500 to 8000 Angstroms, and preferably it will be approximately 5000 Angstroms. The opening 30 includes a generally horizontal bottom surface 40, common to the layer 20, and generally vertical side walls 50 at its outer periphery.

Figure 3:
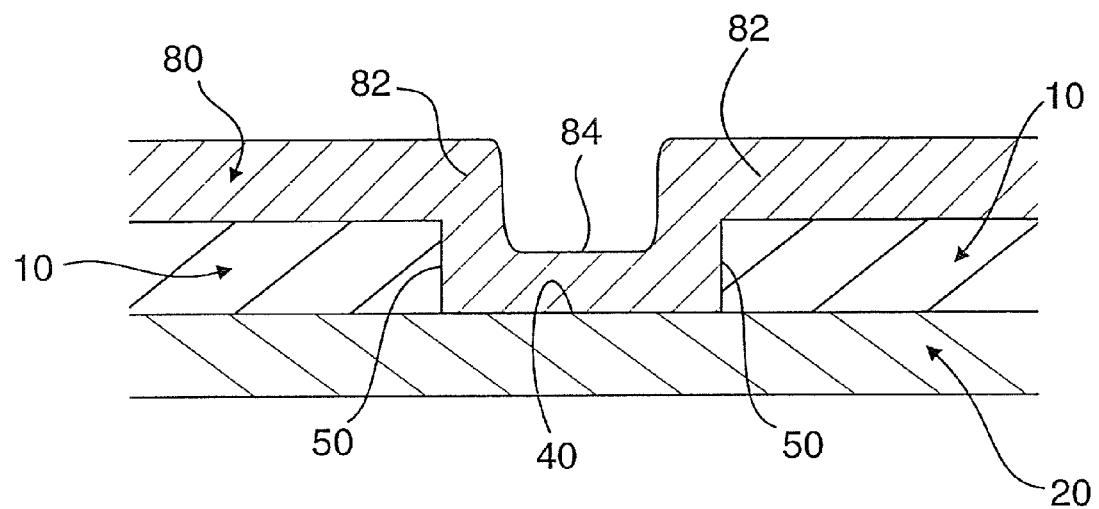
FIG. 3 is a fragmentary cross sectional view of the deposition of a layer of silicon nitride onto the layer of TEOS oxide and into the opening in the layer of TEOS oxide of FIG. 2.

A layer 80 of silicon nitride is then deposited onto the layer 10 and bottom surface 40 using conventional thin film deposition techniques as shown in FIG. 3. The portion of the layer 80 positioned within the opening 30 includes generally vertical side walls 82 extending downward to a generally horizontal surface 84. The layer 80 may have a substantially uniform thickness ranging from about 100 to 750 Angstroms, and preferably it will have a substantially uniform thickness of approximately 300 Angstroms. The layer 80 may comprise a dielectric material such as, for example, TEOS oxide, PECVD oxide, or silicon nitride, and preferably it will comprise silicon nitride.

Figure 4:
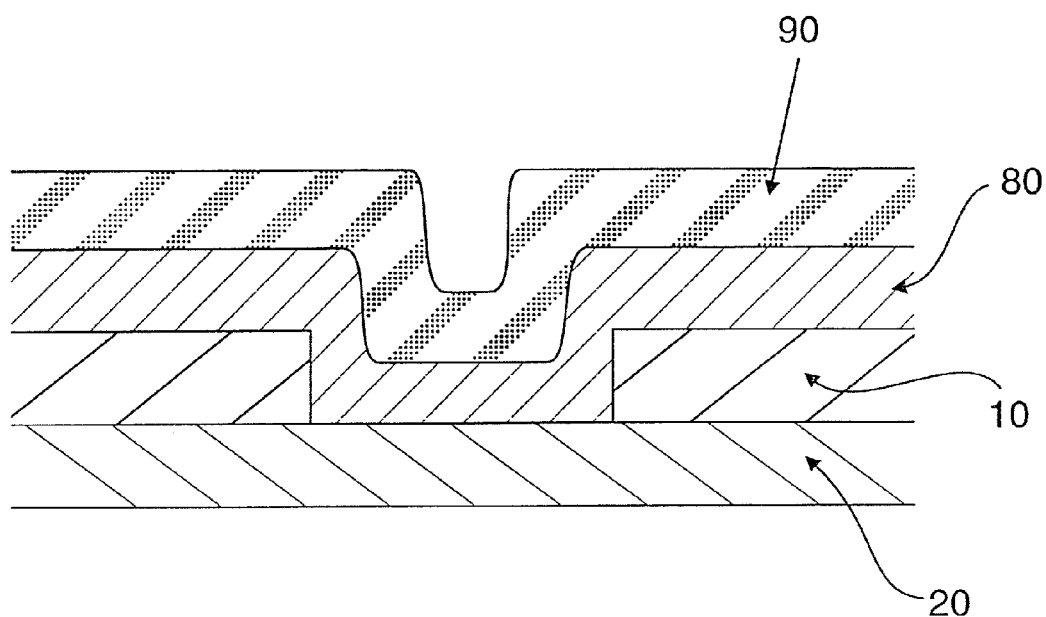
FIG. 4 is a fragmentary cross sectional view of the deposition of a layer of polysilicon onto the layer of silicon nitride and opening of FIG. 3.
Figure 5:
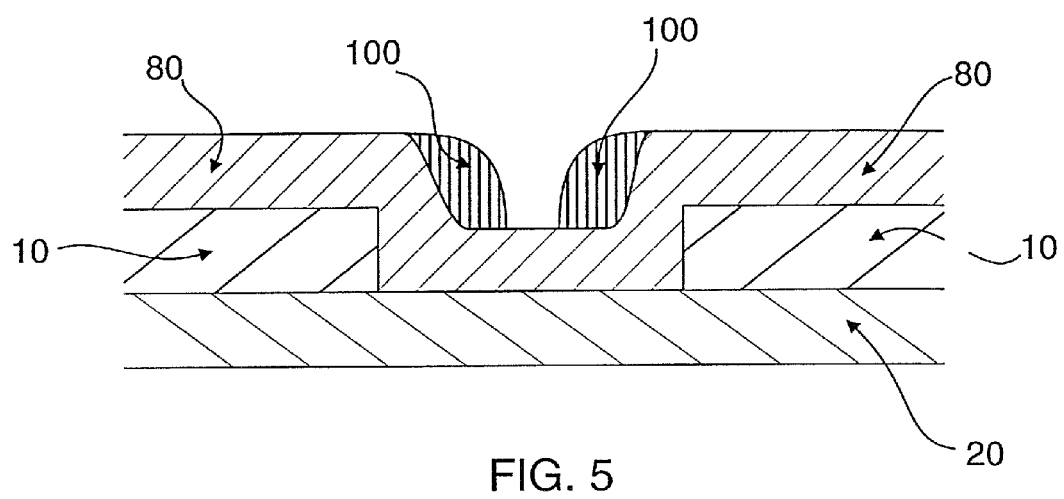
FIG. 5 is a fragmentary cross sectional view of the etching of the layer of polysilicon of FIG. 4 to form a spacer.

A layer 90 of polysilicon is then deposited onto the layer 80 using conventional thin film deposition techniques as shown in FIG. 4. The layer 90 may have a substantially uniform thickness ranging from about 500 to 2500 Angstroms, and preferably it will have a substantially uniform thickness of approximately 1500 Angstroms. The layer 90 may comprise polysilicon or silicon nitride, and preferably it will comprise polysilicon. The layer 90 is then etched using conventional anisotropic etching techniques to form a spacer 100 out of the layer 90 as shown in FIG. 5. The spacer 100 is positioned at the outer periphery of the portion of the layer 80 positioned within the opening 30 and covers the generally vertical side walls 82. The bottom of the spacer 100 will have a lateral thickness substantially equal to the selected thickness of the layer 90 provided the coating of the layer 90 on the layer 80 is conformal.

Figure 6:
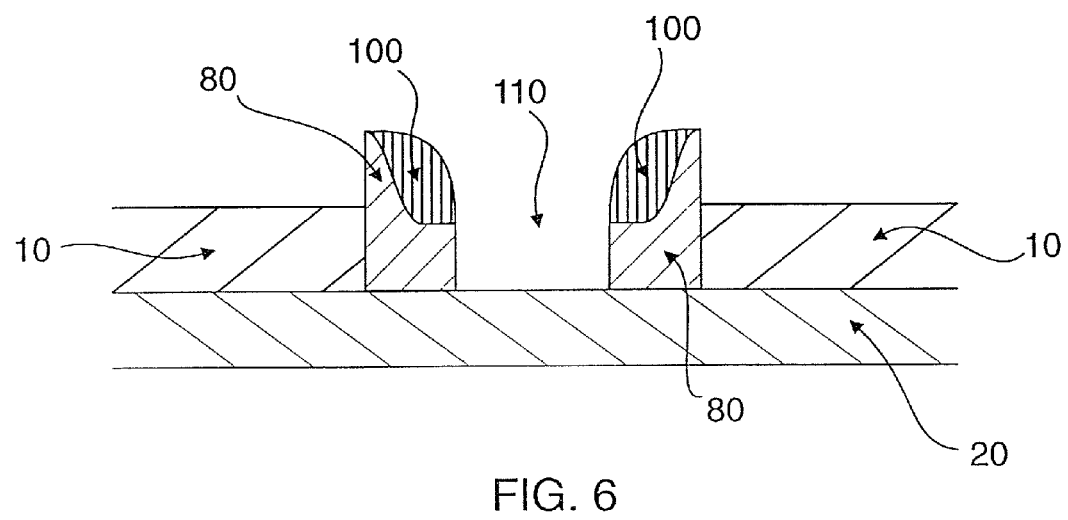
FIG. 6 is a fragmentary cross sectional view of the etching of the exposed portion of the layer of silicon nitride circumscribed by the spacer of FIG. 5 to form an opening in the layer of silicon nitride.
Figure 7:
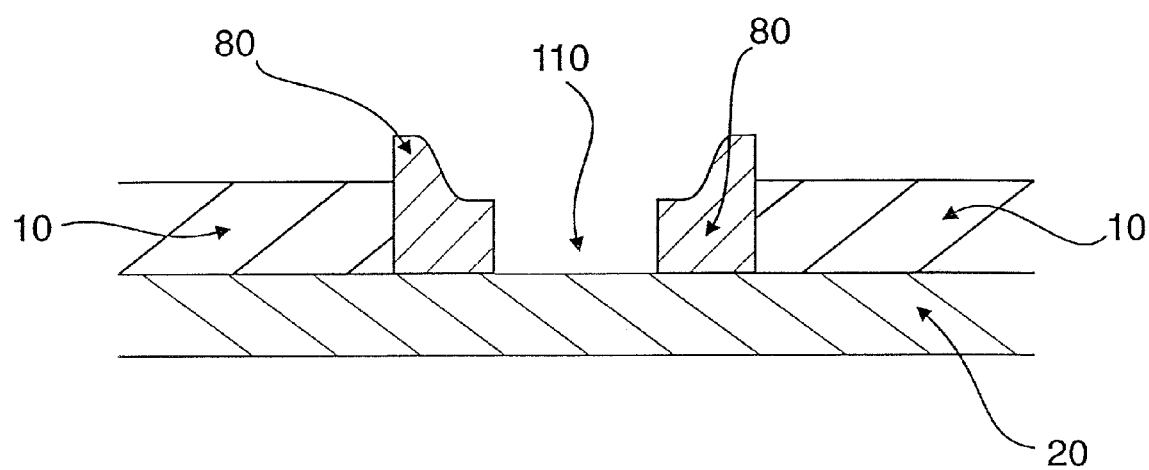
FIG. 7 is a fragmentary cross sectional view of the removal of the spacer of FIG. 6.

The portion of the layer 80 not covered by the spacer 100 is then etched using conventional anisotropic etching techniques to form an opening 110 defining a pore in the layer 80 extending to the layer 20 as shown in FIG. 6. The resulting opening 110 may have a minimum lateral dimension ranging from about 500 to 4000 Angstroms, and preferably it will have a minimum lateral dimension of approximately 1000 Angstroms. The minimum lateral dimension of the opening 110 is defined by the selected thickness of the layer 90 used to form the spacer 100. The spacer 100 is then removed using conventional wet etch techniques as shown in FIG. 7. The disposable spacer 100 thus provides a means of defining the minimum lateral dimension of an ultra-small pore in the layer 80. The first preferred embodiment of the present method thus provides a means of fabricating an ultra-small pore 110 in the layer 80 by use of the disposable spacer 100 positioned adjacent to an edge feature of the layer 80.

Note that while a range of materials may be utilized for each of the layers, the particular materials selected for each of the layers must be selected to provide proper selectivity during the various etching processes as will be recognized by persons of ordinary skill in the art.

Figure 8:
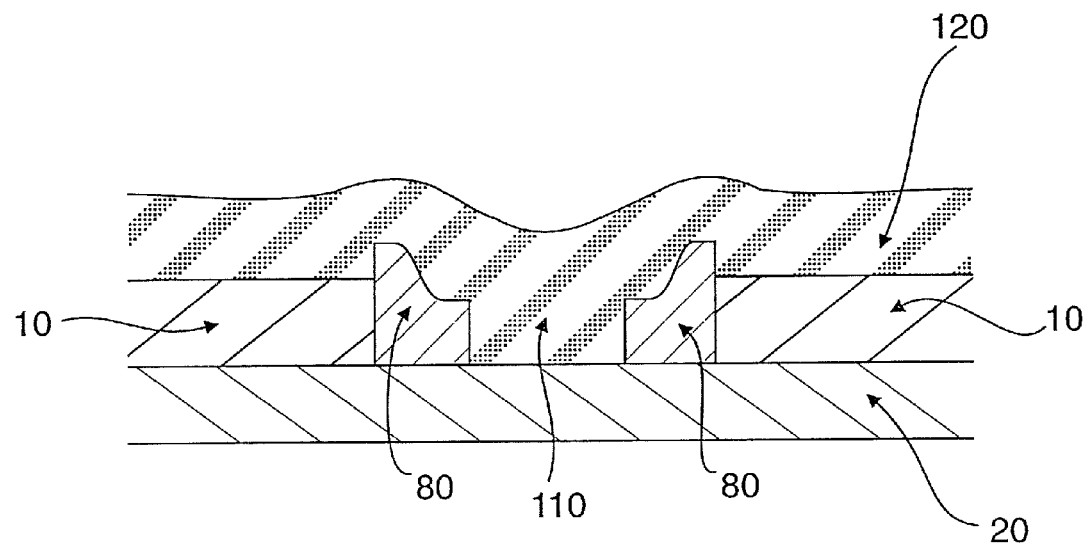
FIG. 8 is a fragmentary cross sectional view of the thin-film deposition of a layer of chalcogenide material into the pore of FIG. 7.
Figure 9:
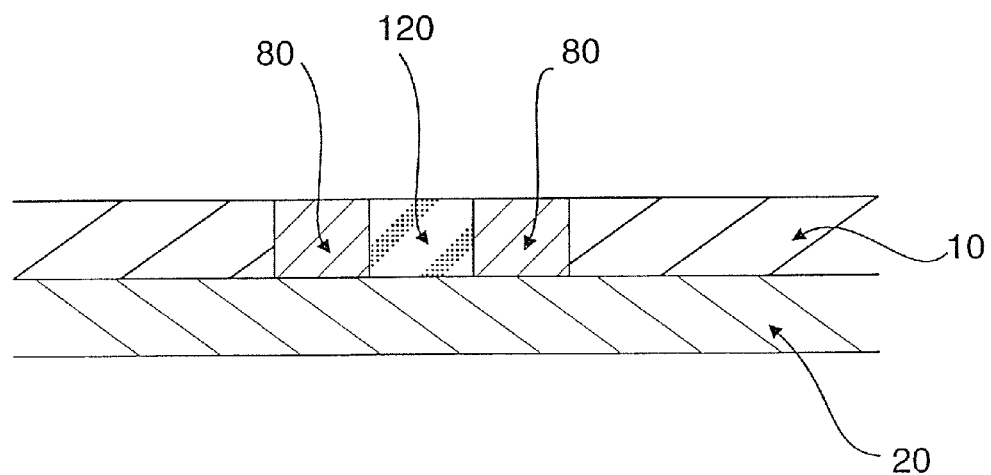
FIG. 9 is a fragmentary cross sectional view of the apparatus of FIG. 8 following a chemical mechanical polishing (CMP) operation to substantially level the layers of material.
Figure 10:
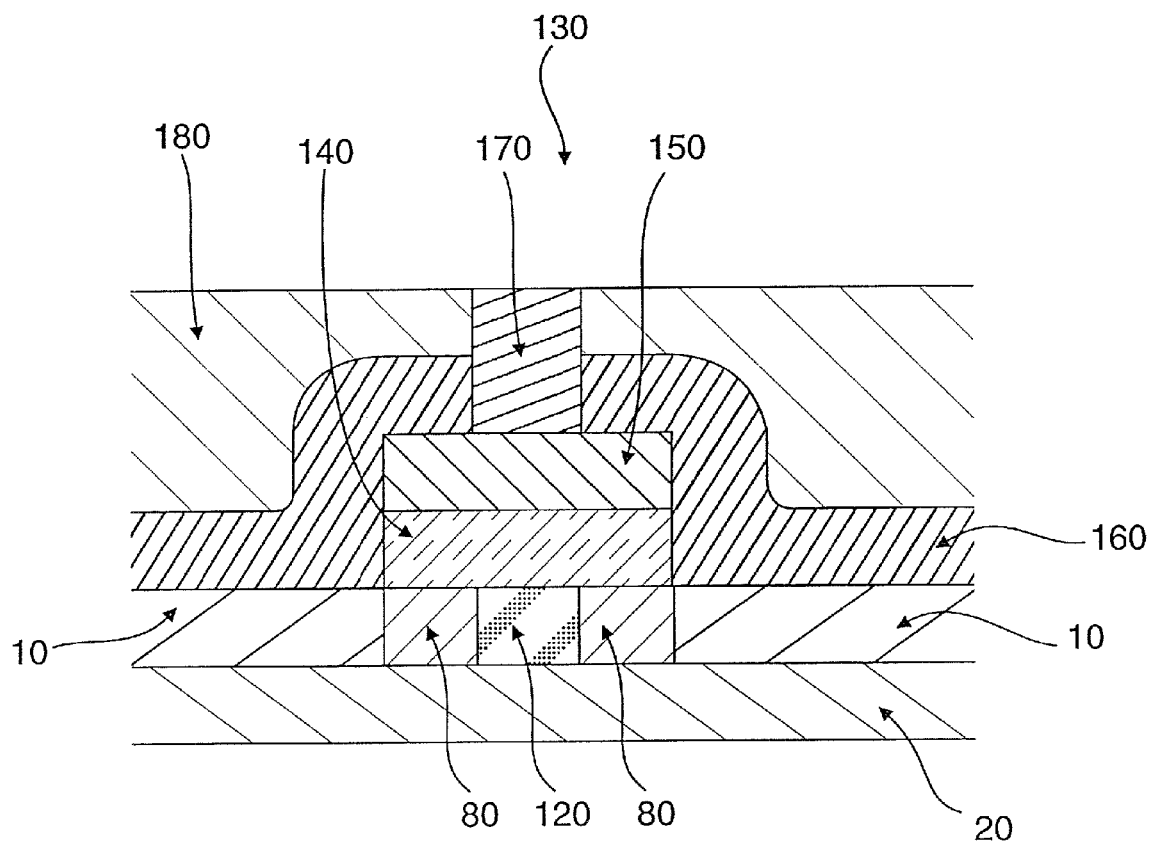
FIG. 10 is a fragmentary cross sectional view of the formation of a chalcogenide memory cell using the apparatus of FIG. 9 illustrating the addition of an upper electrode material layer, an insulating layer, an upper conductive grid layer, and an overlying insulating oxide layer.

The resulting structure illustrated in FIG. 7 includes a conductive substrate 20 and a dielectric layer 80 including an opening 110. This structure is then preferably used to fabricate a chalcogenide memory cell in which the opening 110 provides a pore for placement of an electrode for the chalcogenide memory cell. The chalcogenide memory cell is fabricated by first depositing a layer 120 of a metal organic (MO) material such as, for example, Ti, TiN, or $TiC_xN_y$ using conventional thin film deposition methods such as, for example, chemical vapor deposition (CVD) as illustrated in FIG. 8. In a preferred embodiment, the MO material comprises $TiC_xN_y$. The MOCVD material layer fills the pore 110 and thereby providing an ultra-small electrode for use in the chalcogenide memory cell. The resulting structure is then preferably substantially planarized using a conventional chemical mechanical planarization (CMP) process as illustrated in FIG. 9.

The chalcogenide memory cell 130 is then formed incorporating the ultra-small electrode 120 using conventional semiconductor processing processes such as, for example, thin-film deposition, masking, and etching processes. The chalcogenide memory cell 130 preferably includes a layer 140 of a chalcogenide material, a layer 150 of a conductive material serving as an upper electrode, an insulative layer 160, an upper conductive layer 170, and an overlying insulative oxide layer 180.

The chalcogenide material layer 140 may be deposited using conventional thin film deposition methods. The chalcogenide material layer may range from approximately 100 to 2000 Angstroms, and preferably it is around 1000 Angstroms thick. Typical chalcogenide compositions for these memory cells 130 include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% average, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as $Te_a Ge_b Sb_{100-(a+b)}$, where a is equal to or less than about 70% and preferably between about 60% to about 40%, b is above about 15% and less than 50%, preferably between about 17% to about 44%, and the remainder is Sb.

The layer 150 of conductive material may comprise materials such as, for example, titanium nitride which is deposited over the chalcogenide layer 140 using conventional thin film deposition techniques. The layer 150 thereby provides an upper electrode for the chalcogenide memory cell 130. The layer 150 may have a thickness ranging from approximately 100 to 2000 Angstroms, and preferably it has a thickness of around 600 Angstroms. The layer 150 may comprise a conductive material such as, for example, TiN or Carbon, and preferably it will comprise TiN. The layers 140 and 150 are subsequently etched back using conventional masking and etching processes. The insulating layer 160 is then applied using conventional thin film PECVD deposition processes. The insulating layer 160 may range in thickness from approximately 100 to 5000 Angstroms, and preferably it has a thickness of around 500 Angstroms. The insulating layer 160 may comprise $Si_3N_4$, $SiO_2$, or TEOS, and preferably it will comprise $Si_3N_4$. The overlying oxide layer 180 is then applied using conventional processes such as, for example, TEOS. The insulating layer 160 and the overlying oxide layer 180 are then etched back using conventional masking and etching processes to provide access to the conductive layer or electrode 150 by the upper conductive grid 170. The upper conductive grid material 170 may be applied using conventional thin-film deposition processes. The upper conductive grid material 170 may comprise materials such as, for example, aluminum alloy, TiW, or CVD W over TiN, and preferably it will comprise Al/Cu. In an alternative embodiment, layer 160 is applied using TEOS, ranging in thickness from approximately 500 to 5000 Angstroms, preferably with a thickness of approximately 3500 Angstroms, and layer 180 is eliminated.

In a particularly preferred embodiment, the methods described are utilized to form an array of chalcogenide memory cells 130 which are addressable by an X-Y grid of upper and lower conductors. In the particularly preferred embodiment, diodes are further provided in series with the chalcogenide memories in order to permit read/write operations from/to individual chalcogenide memory cells as will be recognized by persons of ordinary skill in the art.

Figure 11:
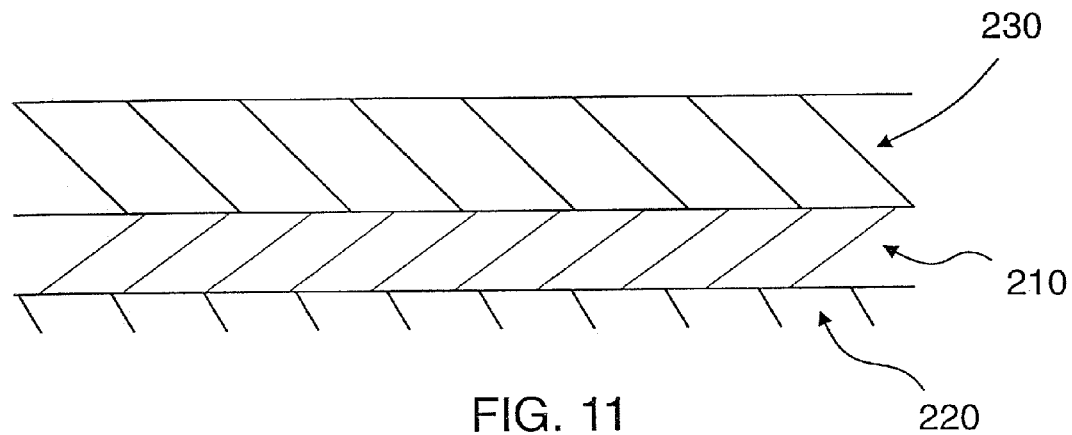
FIG. 11 is a fragmentary cross sectional view of the deposition of layers of silicon nitride and polysilicon onto a substrate of titanium nitride in accordance with a second preferred embodiment of the present invention.

Referring to FIGS. 11 to 19, a second preferred embodiment of a method of fabricating ultra-small electrodes for chalcogenide memory cells will now be described. A layer 210 of silicon nitride is first deposited onto a substrate 220 of titanium nitride. A layer 230 of polysilicon is then deposited onto the layer 210. The layers 210 and 230 are deposited using conventional thin film deposition techniques as shown in FIG. 11. The layer 210 may have a substantially uniform thickness ranging from about 50 to 1000 Angstroms, and preferably it will have a substantially uniform thickness of approximately 500 Angstroms. The layer 210 may be comprised of an insulating material such as, for example, TEOS oxide, silicon nitride, or PECVD oxide, and preferably will be comprised of silicon nitride. The layer 230 may have a substantially uniform thickness ranging from about 1000 to 5000 Angstroms, and preferably it will have a substantially uniform thickness of approximately 4000 Angstroms. The layer 230 may be comprised of TEOS oxide, PECVD oxide, or polysilicon, and preferably will be comprised of polysilicon. The substrate 220 may be comprised of a conductive material such as, for example, TiN, carbon, $WSi_x$ or TiW, and preferably will be comprised of TiN. In a preferred embodiment, the substrate 220 will comprise a conductive lower grid for accessing an array of chalcogenide memory cells.

Figure 12:
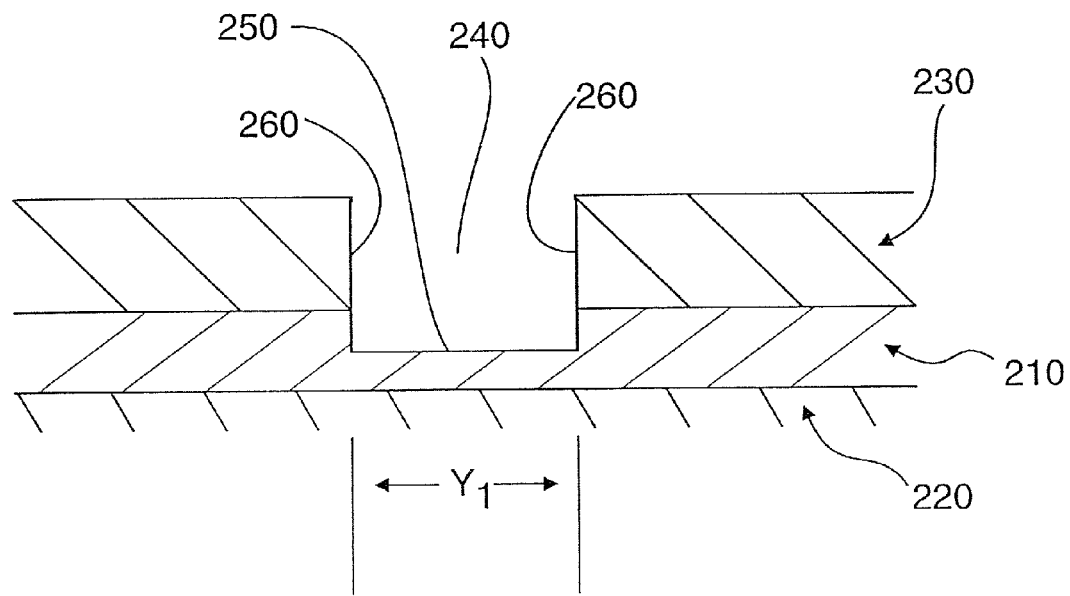
FIG. 12 is a fragmentary cross sectional view of the formation of an opening in the layer of polysilicon and a recess in the layer of silicon nitride of FIG. 11.

An opening 240, extending partially into the layer 210, is then etched in the layers 210 and 230 using conventional anisotropic etching and masking techniques as shown in FIG. 12. The etching process may etch material partially from the layer 210 thereby forming a recess in the layer 210. The opening 240 may be formed, for example, as a rectangular channel or as a substantially circular opening in the layers 210 and 230. The opening 240 is preferably formed using a conventional circular contact hole mask resulting in a substantially circular opening. The minimum lateral dimension $Y_1$ of the opening 240 may range from about 2500 to 8000 Angstroms, and preferably it will be approximately 5000 Angstroms. The opening 240 includes a generally horizontal bottom surface 250 and generally vertical side walls 260 at its outer periphery.

Figure 13:
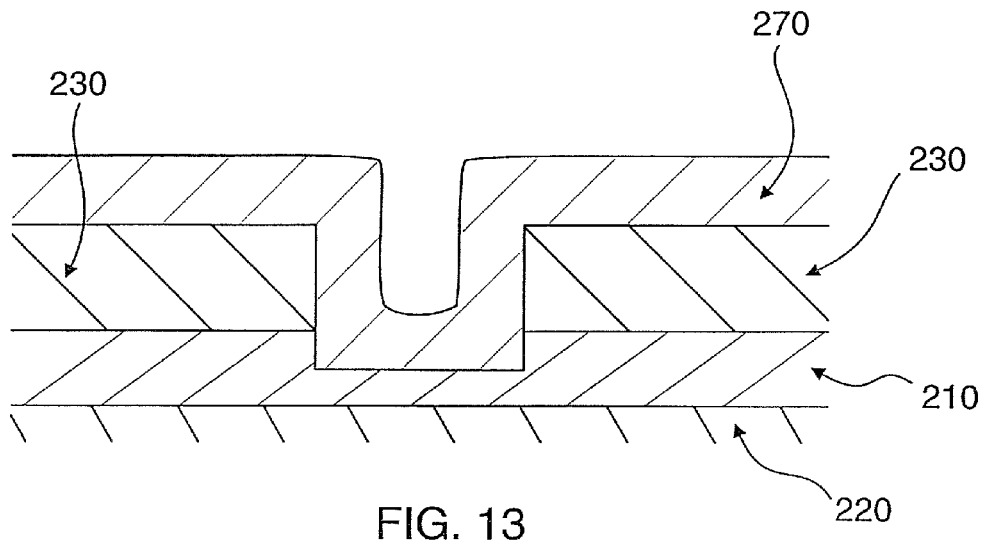
FIG. 13 is a fragmentary cross sectional view of the deposition of a second layer of polysilicon onto the first layer of polysilicon and into the opening in the layer of polysilicon and into the recess in the layer of silicon nitride of FIG. 12.
Figure 14:
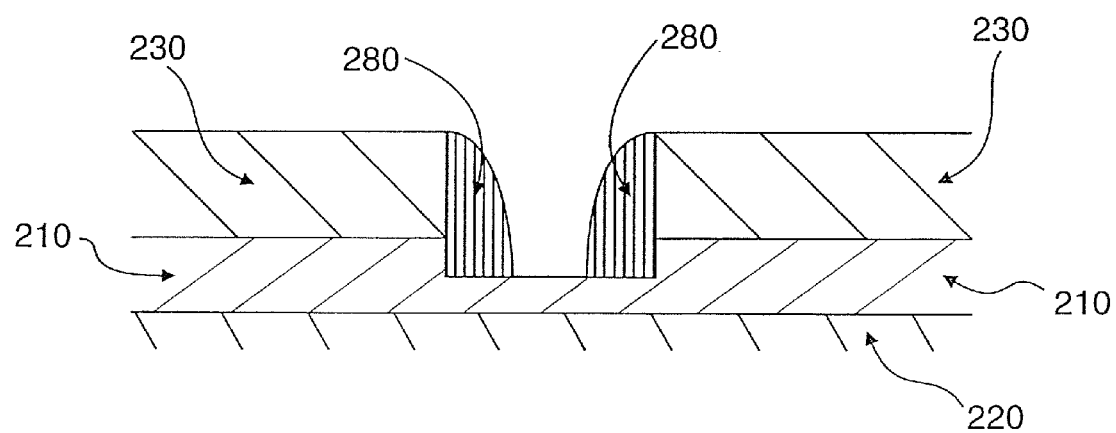
FIG. 14 is a fragmentary cross sectional view of the etching of the second layer of polysilicon of FIG. 13 to form a spacer.

A second layer 270 of polysilicon is then deposited onto the layer 230 and into the opening 240, onto the bottom surface 250 and side walls 260, using conventional thin film deposition techniques as shown in FIG. 13. The layer 270 may have a substantially uniform thickness ranging from about 500 to 3500 Angstroms, and preferably it will have a substantially uniform thickness of approximately 2000 Angstroms. The layer 270 may comprise polysilicon, TEOS oxide, or PECVD oxide, and preferably it will comprise polysilicon. The layer 270 is then etched using conventional anisotropic etching techniques to form a spacer 280 out of the layer 270 as shown in FIG. 14. The spacer 280 is positioned at the outer periphery of the opening 240 and covers the generally vertical side walls 260. The bottom of the spacer 280 will have a lateral thickness substantially equal to the selected thickness of the layer 270 provided the layer 270 conformally coats the layers 210 and 230.

Figure 15:
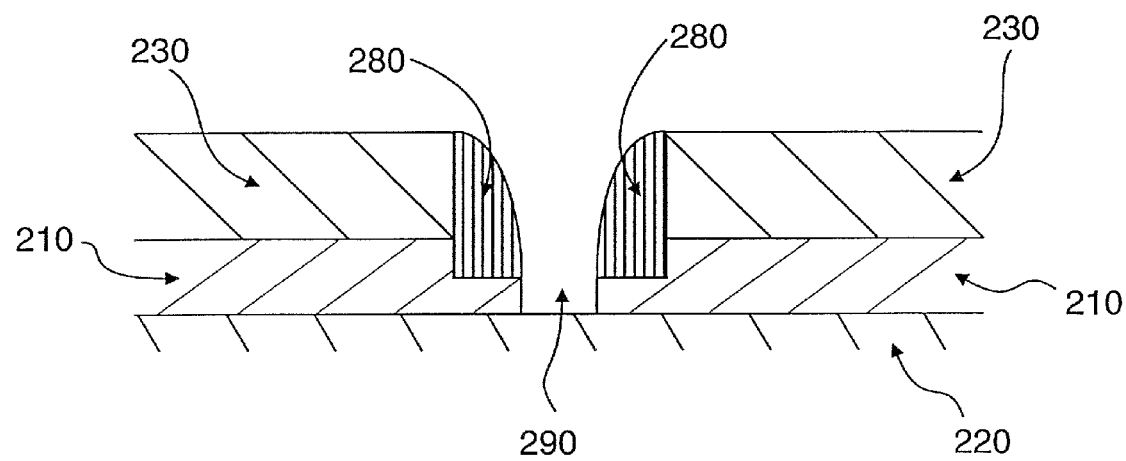
FIG. 15 is a fragmentary cross sectional view of the etching of the portions of the layer of silicon nitride circumscribed by the spacer of FIG. 14 to form an opening in the layer of silicon nitride.
Figure 16:
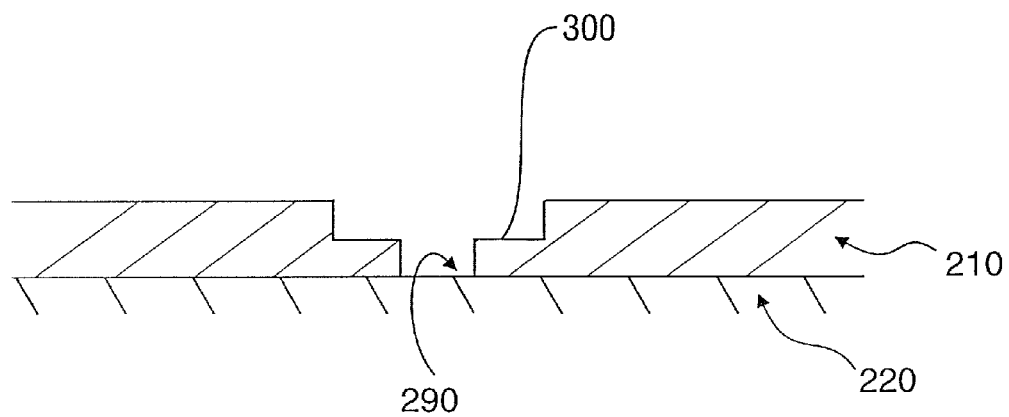
FIG. 16 is a fragmentary cross sectional view of the removal of the spacer and layer of polysilicon of FIG. 15.

The portion of the layer 210 not covered by the spacer 280 are then etched using conventional anisotropic etching techniques to form an opening 290 defining a pore in the layer 210 extending to the layer 220 as shown in FIG. 15. The resulting opening 290 may have a minimum lateral dimension ranging from about 500 to 4000 Angstroms, and preferably it will have a minimum lateral dimension of approximately 1000 Angstroms. The minimum lateral dimension of the opening 290 is defined by the selected thickness of the layer 270 used in forming the spacer 280. The spacer 280 and layer 230 are then removed using conventional etching techniques as shown in FIG. 16. The disposable spacer 280 thus provides a means of defining the minimum lateral dimension of an ultra-small pore in the layer 210. The second preferred embodiment of the present method thus provides a means of fabricating an ultra-small pore 290 in the layer 210 by use of a disposable spacer 280 positioned adjacent to an edge feature of the layer 230.

Note that while a range of materials may be utilized for each of the layers, the particular materials selected for each of the layers must be selected to provide proper selectivity during the various etching processes as will be recognized by persons of ordinary skill in the art.

Figure 17:
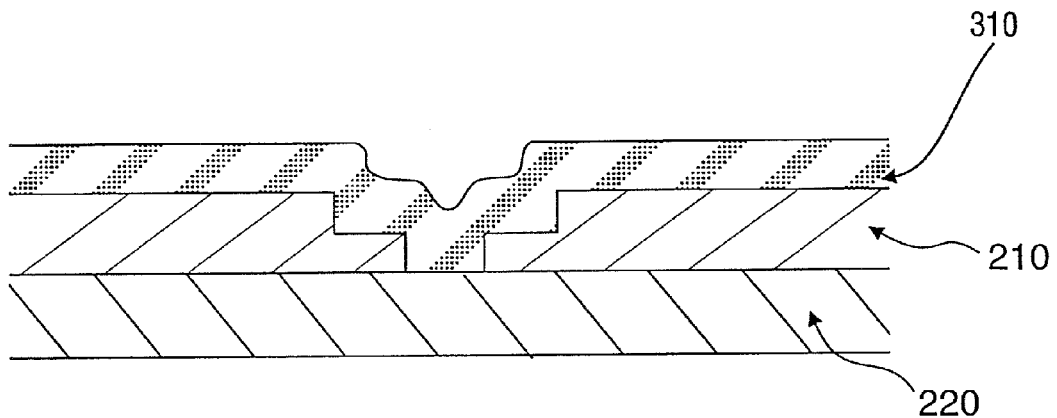
FIG. 17 is a fragmentary cross sectional view of the thin-film deposition of a layer of chalcogenide material into the pore of FIG. 16.
Figure 18:
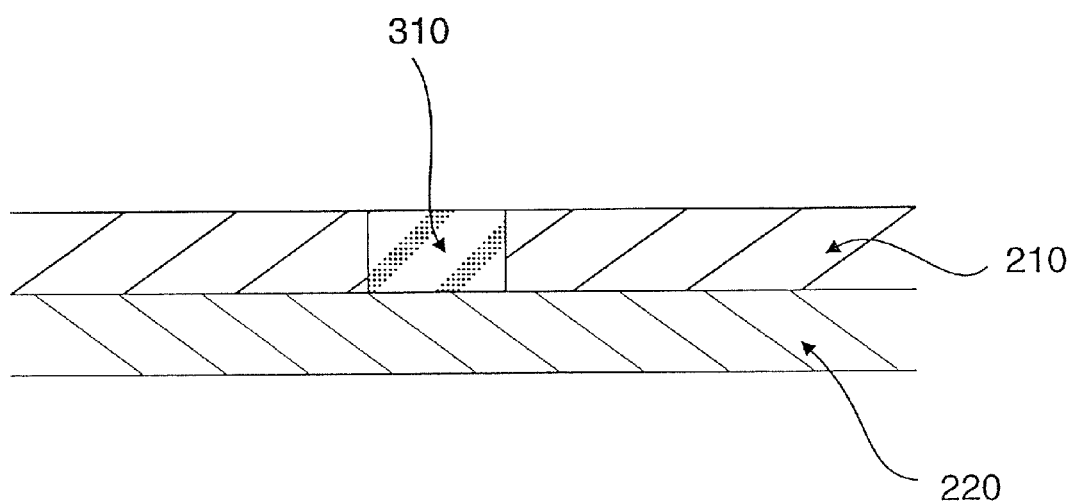
FIG. 18 is a fragmentary cross sectional view of the apparatus of FIG. 17 following a chemical mechanical polishing (CMP) operation to substantially level the layers of material.
Figure 19:
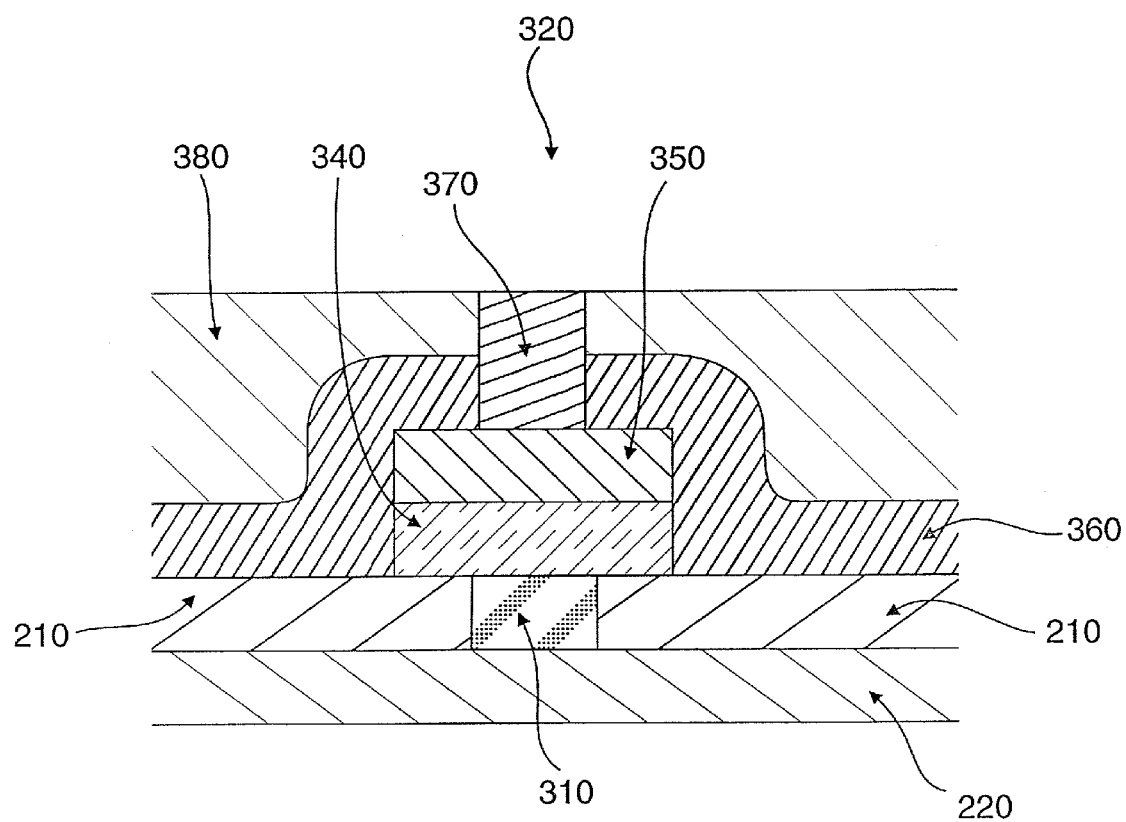
FIG. 19 is a fragmentary cross sectional view of the formation of a chalcogenide memory cell using the apparatus of FIG. 18 illustrating the addition of an upper electrode material layer, an insulating layer, an upper conductive grid layer, and an overlying insulating oxide layer.

The resulting structure illustrated in FIG. 16 includes a conductive substrate 220 and an insulating layer 210 including the opening 290 surrounded by a recess 300. The resulting structure illustrated in FIG. 16 including the opening 290 may also be provided, without the recess 300 in the layer 210, where the etch selectivities of the previous processes avoid etching the recess 300 in the layer 210. This structure is then preferably used to fabricate a chalcogenide memory cell in which the opening 290 provides a pore for placement of an electrode for the chalcogenide memory cell. The chalcogenide memory cell is fabricated by first depositing a layer 310 of a metal organic (MO) material such as, for example, Ti, TiN, or $TiC_xN_y$, using conventional thin film deposition methods such as, for example, chemical vapor deposition (CVD) as illustrated in FIG. 17. In a preferred embodiment, the MO material comprises $TiC_xN_y$. The MOCVD material layer fills the pore 290 and thereby providing an ultra-small electrode for use in the chalcogenide memory cell. The resulting structure is then preferably substantially planarized using a conventional chemical mechanical planarization (CMP) process as illustrated in FIG. 18.

The chalcogenide memory cell 320 is then formed incorporating the ultra-small electrode 310 using conventional semiconductor processing processes such as, for example, thin-film deposition, masking, and etching processes. The chalcogenide memory cell 310 preferably includes a layer 340 of a chalcogenide material, a layer 350 of a conductive material serving as an upper electrode, an insulative layer 360, an upper conductive layer 370, and an overlying insulative oxide layer 380.

The chalcogenide material layer 340 may be deposited using conventional thin film deposition methods and may have a thickness ranging from approximately 100 to 2000 Angstroms, and preferably it has a thickness of about 1000 Angstroms. Typical chalcogenide compositions for these memory cells 320 include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% average, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as $Te_aGe_bSb_{100-(a+b)}$, where a is equal to or less than about 70% and preferably between about 60% to about 40%, b is above about 15% and less than 50%, preferably between about 17% to about 44%, and the remainder is Sb.

The layer 350 of conductive material may comprise materials such as, for example, titanium nitride which is deposited over the chalcogenide layer 340 using conventional thin film deposition techniques. The layer 350 thereby provides an upper electrode for the chalcogenide memory cell 320. The layer 350 may range in thickness from approximately 100 to 2000 Angstroms, and preferably it has a thickness of about 600 Angstroms. The layer 350 may comprise a conductive material such as, for example, TiN or Carbon, and preferably it will comprise TiN. The layers 340 and 350 are subsequently etched back using conventional masking and etching processes. The insulating layer 360 is then applied using conventional thin film PECVD deposition processes. The insulating layer 360 may comprise $Si_3N_4$, $SiO_2$, or TEOS, and preferably it will comprise $Si_3N_4$. The insulating layer 360 may range in thickness from approximately 100 to 5000 Angstroms, and preferably it has a thickness of around 500 Angstroms The overlying oxide layer 380 is then applied using conventional processes such as, for example, TEOS. The insulating layer 360 and the overlying oxide layer 380 are then etched back using conventional masking and etching processes to provide access to the conductive layer or electrode 350 by the upper conductive grid 370. The upper conductive grid material 370 may be applied using conventional thin-film deposition processes. The upper conductive grid material 370 may comprise materials such as, for example, aluminum alloy, TiW, or CVD W over TiN, and preferably it will comprise Al/Cu. In an alternative embodiment, layer 360 is applied using TEOS, ranging in thickness from approximately 500 to 5000 Angstroms, preferably with a thickness of approximately 3500 Angstroms, and layer 380 is eliminated.

In a particularly preferred embodiment, the methods described are utilized to form an array of chalcogenide memory cells 320 which are addressable by an X-Y grid of upper and lower conductors. In the particularly preferred embodiment, diodes are further provided in series with the chalcogenide memories in order to permit read/write operations from/to individual chalcogenide memory cells as will be recognized by persons of ordinary skill in the art.

Figure 20:
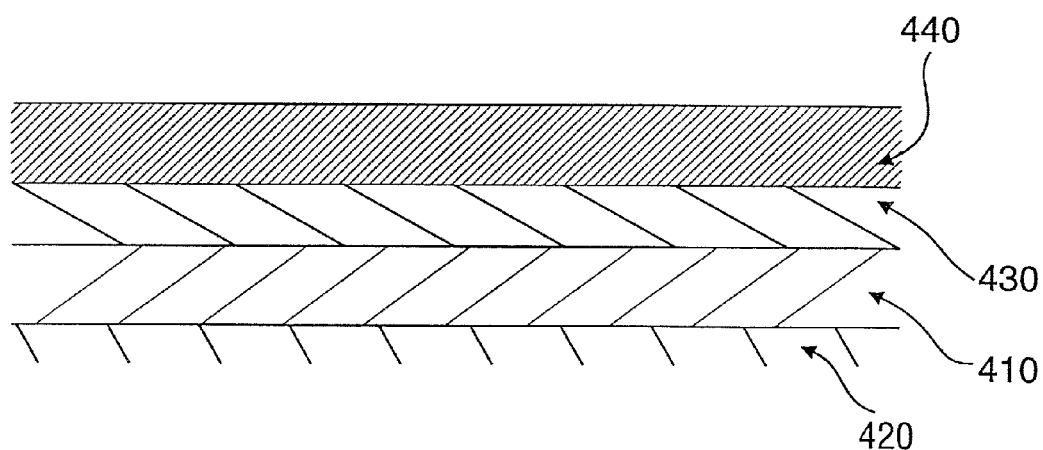
FIG. 20 is a fragmentary cross sectional view of the deposition of layers of silicon nitride, silicon dioxide, and polysilicon onto a substrate of titanium nitride in accordance with a third preferred embodiment of the present invention.

Referring to FIGS. 20 to 29, a third preferred embodiment of a method of fabricating ultra-small pores will now be described. A layer 410 of silicon nitride is first deposited onto a substrate 420 of titanium nitride. Layers 430 of silicon dioxide and 440 of polysilicon are then successively deposited onto the layer 410. In an alternative embodiment, layer 430 is not deposited. The layers 410, 430, and 440 are deposited using conventional thin film deposition techniques as shown in FIG. 20. The layer 410 may have a substantially uniform thickness ranging from about 100 to 1000 Angstroms, and preferably it will have a substantially uniform thickness of approximately 500 Angstroms. The layer 410 may be comprised of a dielectric material such as, for example, silicon nitride, TEOS oxide, or PECVD oxide, and preferably it will be comprised of silicon nitride. The layer 430 may have a substantially uniform thickness ranging from about 100 to 1500 Angstroms, and preferably it will have a substantially uniform thickness of approximately 700 Angstroms. The layer 430 may be comprised of TEOS oxide or PECVD oxide, and preferably it will be comprised of TEOS oxide. The layer 440 may have a substantially uniform thickness ranging from about 2000 to 5000 Angstroms, and preferably it will have a substantially uniform thickness of approximately 4000 Angstroms. The layer 440 may be comprised of polysilicon, TEOS oxide, or PECVD oxide, and preferably will be comprised of polysilicon. The substrate 420 may be comprised of a conductive material such as, for example, TiN, carbon, $WSi_x$, or TiW, and preferably will be comprised of TiN. In a preferred embodiment, the substrate layer 420 will comprise a conductive lower grid for accessing an array of chalcogenide memory cells.

Figure 21:
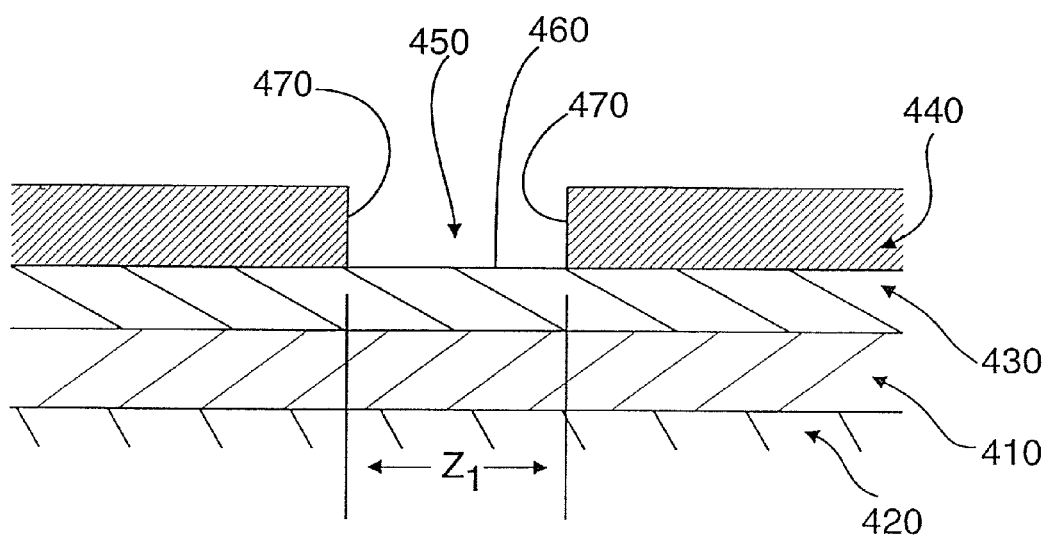
FIG. 21 is a fragmentary cross sectional view of the formation of an opening in the layer of polysilicon of FIG. 20.

An opening 450, extending downward to the layer 430, is then etched in the layer 440 using conventional anisotropic etching and masking techniques as shown in FIG. 21. The composition of the layer 430 is selected to prevent any material within the layer 410 from being etched away by this process. The opening 450 may be formed, for example, as a rectangular channel or as a substantially circular opening in the layer 440. The opening 450 is preferably formed using a conventional contact hole mask resulting in a substantially circular opening. The minimum lateral dimension $z_1$ of the opening 450 may range from about 2500 to 8000 Angstroms, and preferably it will be approximately 5000 Angstroms. The opening 450 includes a generally horizontal bottom surface 460 and generally vertical side walls 470 at its outer periphery.

Figure 22:
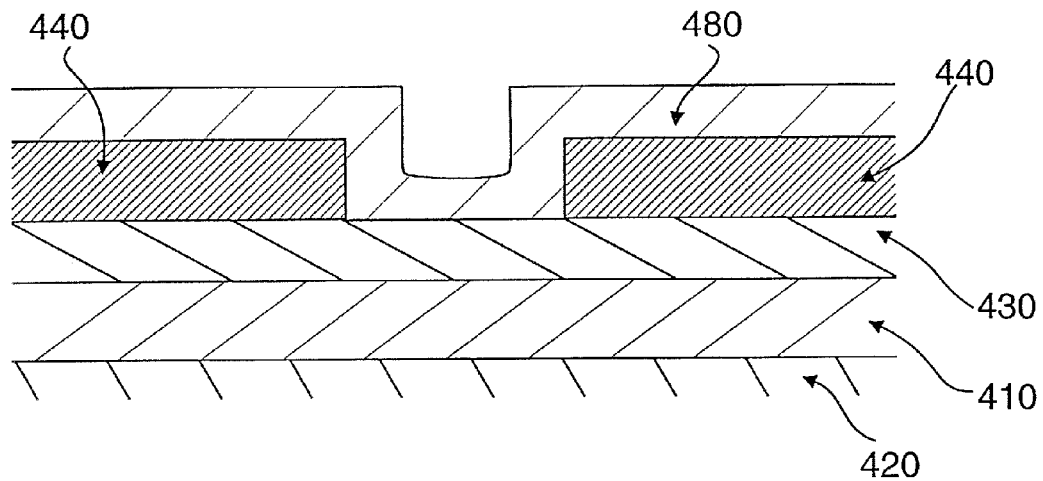
FIG. 22 is a fragmentary cross sectional view of the deposition of a second layer of polysilicon onto the first layer of polysilicon and into the opening in the first layer of polysilicon of FIG. 21.
Figure 23:
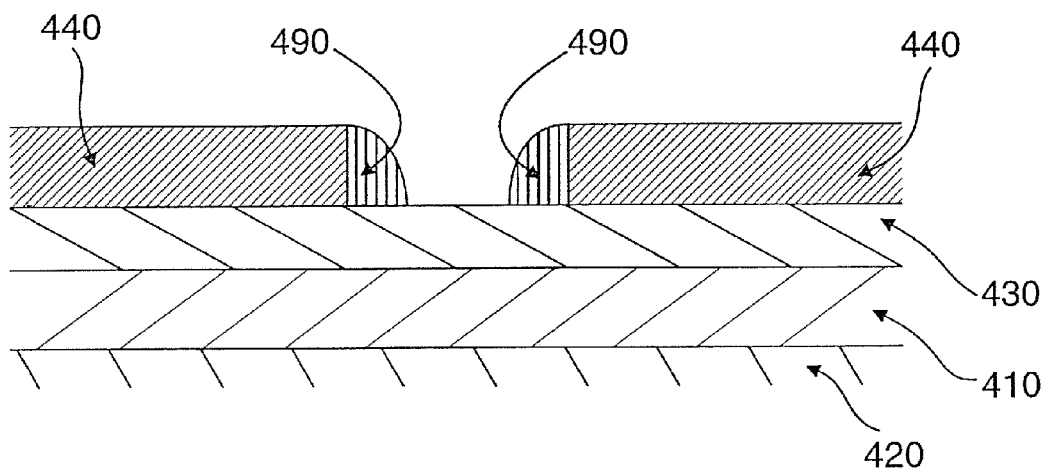
FIG. 23 is a fragmentary cross sectional view of the etching of the second layer of polysilicon of FIG. 22 to form a spacer.

A second layer 480 of polysilicon is then deposited onto the layer 440 and into the opening 450, onto the bottom surface 460 and side walls 470, using conventional thin film deposition techniques as shown in FIG. 22. The layer 480 may have a substantially uniform thickness ranging from about 500 to 3500 Angstroms, and preferably it will have a substantially uniform thickness of approximately 2000 Angstroms. The layer 480 may comprise polysilicon, TEOS oxide, or PECVD oxide, and preferably it will comprise polysilicon. The layer 480 is then etched using conventional anisotropic etching techniques to form a spacer 490 out of the layer 480 as shown in FIG. 23. The spacer 490 is positioned at the outer periphery of the opening 450 and covers the generally vertical side walls 470. The bottom of the spacer 490 will have a lateral thickness substantially equal to the selected thickness of the layer 480 provided that the layer 480 conformally coats the layer 440.

Figure 24:
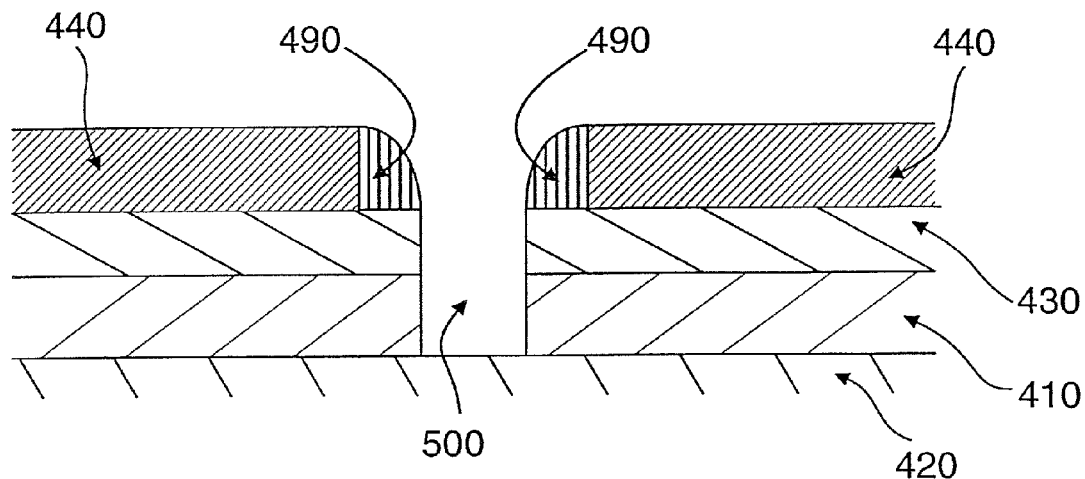
FIG. 24 is a fragmentary cross sectional view of the etching of the portions of the layers of silicon nitride and silicon dioxide circumscribed by the spacer of FIG. 21 to form an opening in the layers of silicon nitride and silicon dioxide.
Figure 25:
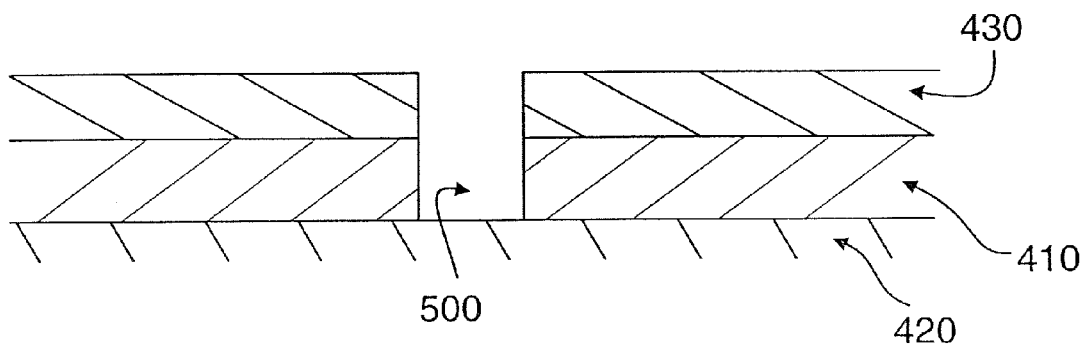
FIG. 25 is a fragmentary cross sectional view of the removal of the spacer and layers of silicon dioxide and polysilicon of FIG. 24.
Figure 26:
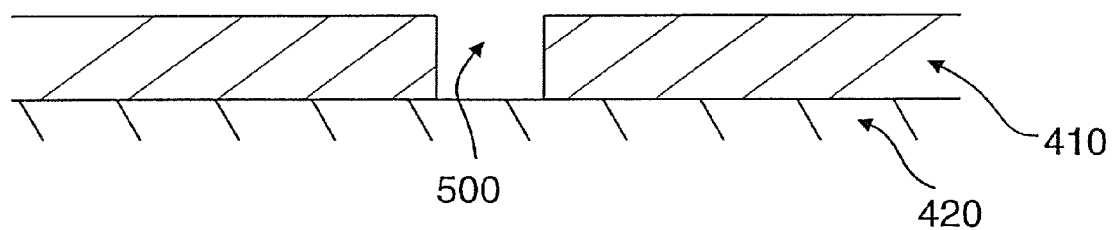
FIG. 26 is a fragmentary cross sectional view of the removal of the layer of silicon dioxide of FIG. 25.

The portions of the layers 410 and 430 not covered by the spacer 490 are then etched using conventional anisotropic etching techniques to form an opening 500 defining a pore in the layers 410 and 430 extending to the layer 420 as shown in FIG. 24. The resulting opening 500 may have a minimum lateral dimension ranging from about 500 to 4000 Angstroms, and preferably it will have a minimum lateral dimension of approximately 1000 Angstroms. The minimum lateral dimension of the opening 500 is defined by the selected thickness of the layer 480. The spacer 490, layer 440, and layer 430 are then removed using conventional etching techniques as shown in FIGS. 25 and 26. The disposable spacer 490 thus provides a means of defining an ultra-small pore in the layers 410 and 430. The third preferred embodiment of the present method thus provides a means of fabricating an ultra-small pore 500 in the layers 410 and 430 by use of the disposable spacer 490 positioned adjacent to an edge feature of the layer 440.

Note that while a range of materials may be utilized for each of the layers, the particular materials selected for each of the layers must be selected to provide proper selectivity during the various etching processes.

Figure 27:
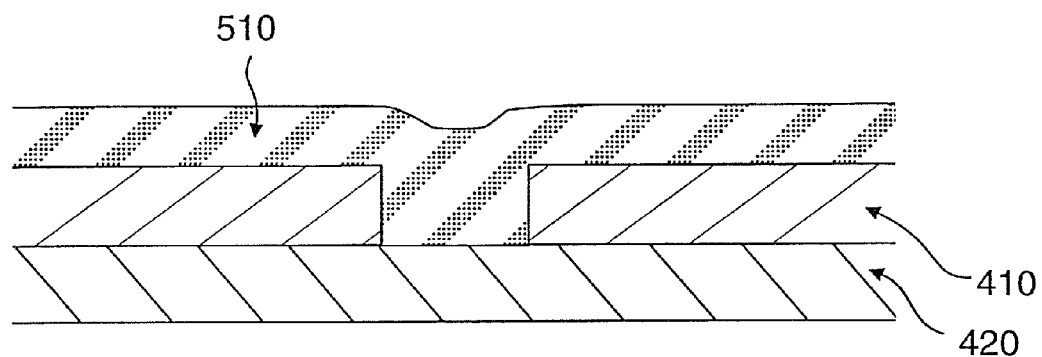
FIG. 27 is a fragmentary cross sectional view of the thin-film deposition of a layer of chalcogenide material into the pore of FIG. 26.
Figure 28:
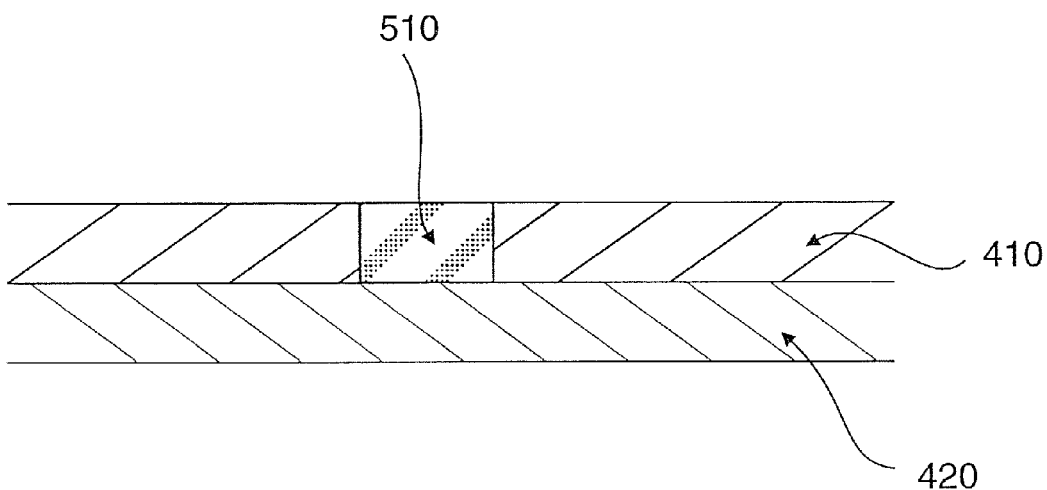
FIG. 28 is a fragmentary cross sectional view of the apparatus of FIG. 27 following a chemical mechanical polishing (CMP) operation to substantially level the layers of material.
Figure 29:
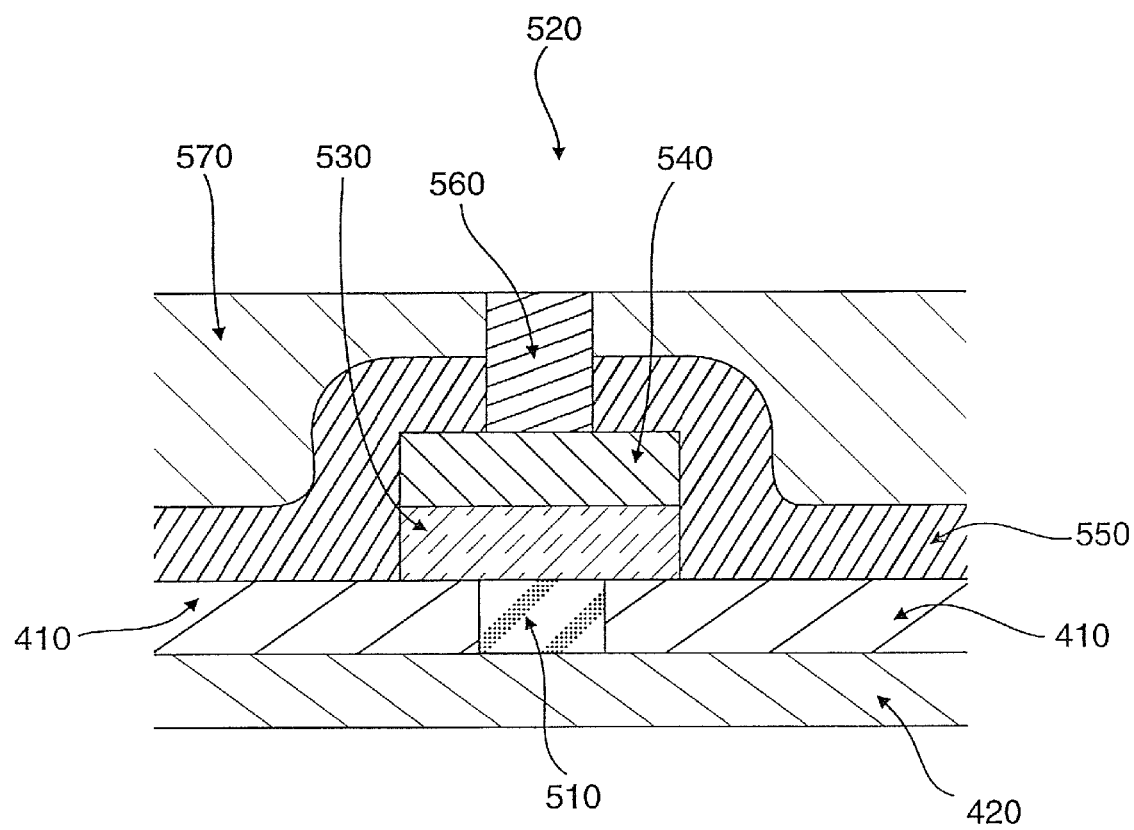
FIG. 29 is a fragmentary cross sectional view of the formation of a chalcogenide memory cell using the apparatus of FIG. 28 illustrating the addition of an upper electrode material layer, an insulating layer, an upper conductive grid layer, and an overlying insulating oxide layer.

The resulting structure illustrated in FIG. 26 includes a conductive substrate 420 and a dielectric layer 410 including the opening 500. This structure is then preferably used to fabricate a chalcogenide memory cell in which the opening 500 provides a pore for placement of an electrode for the chalcogenide memory cell. The chalcogenide memory cell is fabricated by first depositing a layer 510 of a metal organic (MO) material such as, for example, Ti, TiN, or TiC$_x$N$_y$ using conventional thin film deposition methods such as, for example, chemical vapor deposition (CVD) as illustrated in FIG. 27. In a preferred embodiment, the MO material comprises TiC$_x$N$_y$. The MOCVD material layer fills the pore 500 and thereby provides an ultra-small electrode for use in the chalcogenide memory cell. The resulting structure is then preferably substantially planarized using a conventional chemical mechanical planarization (CMP) process as illustrated in FIG. 28.

The chalcogenide memory cell 520 is then formed incorporating the ultra-small electrode 510 using conventional semiconductor processing processes such as, for example, thin-film deposition, masking, and etching processes. The chalcogenide memory cell 520 preferably includes a layer 530 of a chalcogenide material, a layer 540 of a conductive material serving as an upper electrode, an insulative layer 550, an upper conductive layer 560, and an overlying insulative oxide layer 570.

The chalcogenide material layer 530 may be deposited using conventional thin film deposition methods. The chalcogenide material layer 530 may range in thickness from approximately 100 to 2000 Angstroms, and preferably it has a thickness of around 1000 Angstroms. Typical chalcogenide compositions for these memory cells 520 include average concentrations of Te in the amorphous state well below 70%, typically below about 60% and ranging in general from as low as about 23% up to about 56% Te, and most preferably to about 48% to 56% Te. Concentrations of Ge are typically above about 15% and range from a low of about 17% to about 44% average, remaining generally below 50% Ge, with the remainder of the principal constituent elements in this class being Sb. The percentages given are atomic percentages which total 100% of the atoms of the constituent elements. In a particularly preferred embodiment, the chalcogenide compositions for these memory cells comprise a Te concentration of about 55%, a Ge concentration of about 22%, and a Sb concentration of about 22%. This class of materials are typically characterized as Te$_a$Ge$_b$Sb$_{100-(a+b)}$, where a is equal to or less than about 70% and preferably between about 60% to about 40%, b is above about 15% and less than 50%, preferably between about 17% to about 44%, and the remainder is Sb.

The layer 540 of conductive material may comprise materials such as, for example, titanium nitride which is deposited over the chalcogenide layer 530 using conventional thin film deposition techniques. The layer 540 thereby provides an upper electrode for the chalcogenide memory cell 520. The layer 540 may range in thickness from approximately 100 to 2000 Angstroms, and preferably it has a thickness of around 600 Angstroms. The layer 540 may comprise a conductive material such as, for example, TiN or Carbon, and preferably it will comprise TiN. The layers 530 and 540 are subsequently etched back using conventional masking and etching processes. The insulating layer 550 is then applied using conventional thin film PECVD deposition processes. The insulating layer 550 may comprise Si$_3$N$_4$, SiO$_2$, or TEOS, and preferably it will comprise Si$_3$N$_4$. The insulating layer 550 may range in thickness from approximately 100 to 5000 Angstroms, and preferably it has a thickness of around 500 Angstroms. The overlying oxide layer 570 is then applied using conventional processes such as, for example, TEOS. The insulating layer 550 and the overlying oxide layer 570 are then etched back using conventional masking and etching processes to provide access to the conductive layer or electrode 540 by the upper conductive grid 560. The upper conductive grid material 560 may be applied using conventional thin-film deposition processes. The upper conductive grid material 560 may comprise materials such as, for example, aluminum alloy, TiW, or CVD W over TiN, and preferably it will comprise Al/Cu. In an alternative embodiment, layer 550 is applied using TEOS, ranging in thickness from approximately 500 to 5000 Angstroms, preferably with a thickness of approximately 3500 Angstroms, and layer 570 is eliminated.

In a particularly preferred embodiment, the methods described are utilized to form an array of chalcogenide memory cells 520 which are addressable by an X-Y grid of upper and lower conductive grids. In the particularly preferred embodiment, diodes are further provided in series with each of the chalcogenide memories in order to permit read/write operations from/to individual chalcogenide memory cells as will be recognized by persons of ordinary skill in the art.

A method has been described for forming ultra-small electrodes for use in chalcogenide memory cells using disposable internal spacers. More generally, the present method will also provide ultra-small plug contacts or vias in semiconductor devices such as, for example, static random access and dynamic random access memories. Such semiconductor devices require contacts to permit electrical connection to active regions of memory elements. The present method of forming will also provide ultra-small contacts or vias in semiconductor devices generally thereby permitting further reduction in the physical size of such devices.

While the invention is susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the appended claims.

What is claimed is:

1. A memory device comprising:
an array of chalcogenide memory cells;
a conductive substrate comprising an X-Y grid of electrodes on which the array of chalcogenide memory cells are formed;
each memory cell comprising; a) a lower electrode formed in a window formed in a layer of insulating material, wherein the lower electrode material of the chalcogenide memory cells is selected from the group consisting of Ti, TiN, and $TiC_xN_y$, the window having insulator spacers formed therein defining a dimension of the memory cell lower electrode; b) a chalcogenide material formed over the lower electrode; and c) an upper electrode formed over the chalcogenide material and an insulator formed over the memory cell;
the upper electrode in electrical contact with an upper X-Y grid of conductors;
diodes in series with the chalcogenide memory cells;
wherein the upper and lower X-Y grid of conductors are configured for addressing the memory cells; and
wherein the diodes provide for read/write operations of the memory cells.

2. The memory device of claim 1, wherein the chalcogenide material is selected from the group consisting of Se, Te, Ge, Sb and compositions of at least two of Se, Te, Ge, and Sb.

3. The memory device of claim 2, wherein the chalcogenide material includes Te, Ge and Sb in the ratio $Te_a Ge_b Sb_{100-(a+b)}$ when a is less than about 70 and b is the range from greater than about 15 to less than about 50.

4. The memory device of claim 3, wherein a is in the range of about 40 to about 60 and b is in the range of about 17 to about 44.

5. A memory array device comprising:
an array of chalcogenide memory cells;
a conductive substrate comprising an X-Y grid of electrodes on which the array of chalcogenide memory cells are formed;
each memory cell comprising: a) a first electrode within a pore of a dielectric layer, wherein the first electrode comprises material selected from the group consisting of Ti, TiN, and $TiC_xN_y$, the dielectric layer formed over the X-Y grid of electrodes and the pore extending from an upper surface of the dielectric layer to a lower surface of the dielectric layer adjacent the conductive substrate, the first electrode having an outer surface that is substantially circular and having an exposed first surface having a sublithographic dimension in a first direction parallel to the exposed first surface, the first electrode also having a second surface opposite the first surface and adjacent the conductive substrate, the second surface having a sublithographic dimension in an additional direction parallel to the second surface; and b) a layer of phase change material coupled to the exposed first surface of the first electrode.

6. The memory array device of claim 5, wherein the phase change material includes a chalcogenide material.

7. The memory array device of claim 5, further including a second electrode in contact with an upper surface of the phase change material.

8. The memory array device of claim 5, wherein the second electrode and the phase change material have lithographic dimensions in a second direction parallel to the upper surface of the phase change material.

9. A memory array device comprising:
an array of chalcogenide memory cells;
a conductive substrate comprising an X-Y grid of electrodes on which the array of chalcogenide memory cells are formed;
each memory cell comprising: a) a first electrode within a pore of a dielectric layer, wherein the first electrode comprises material selected from the group consisting of Ti, TiN, and $TiC_xN_y$, the dielectric layer formed over the X-Y grid of electrodes and the pore extending from an upper surface of the dielectric layer to a lower surface of the dielectric layer adjacent the conductive substrate, the first electrode having an outer surface that is generally rectangular and having an exposed first surface having a sublithographic dimension in a first direction parallel to the exposed first surface, the first electrode also having a second surface opposite the first surface and adjacent the conductive substrate, the second surface having a sublithographic dimension in an additional direction parallel to the second surface; and b) a layer of phase change material coupled to the exposed first surface of the first electrode.

10. The memory array device of claim 9, wherein the exposed first surface and the outer surface are essentially orthogonal.

11. The memory array device of claim 9, wherein the phase change material includes a chalcogenide material.

12. The memory array device of claim 9, further including a second electrode in contact with an upper surface of the phase change material.

13. The memory array device of claim 12, wherein the second electrode and the phase change material have lithographic dimensions in a second direction parallel to the upper surface of the phase change material.

14. The memory array device of claim 9, further including diodes coupled in series with the memory cell array to provide read/write operations from/to the memory cell.

15. A device with a memory array, the memory array comprising:
an array of chalcogenide memory cells;
a conductive substrate comprising an X-Y grid of electrodes on which the array of chalcogenide memory cells are formed;
each memory cell comprising: a) a first electrode disposed on the X-Y grid of electrodes, wherein the first electrode comprises material selected from the group consisting of Ti, TiN, and $TiC_xN_y$, the first electrode including a sublithographic lateral dimension parallel to the substrate; b) a phase change material coupled to the first electrode, wherein the phase change material includes a lateral dimension parallel to the substrate and greater than the sublithographic lateral dimension of the first electrode; and c) a second electrode disposed over the phase change material, wherein the second electrode includes a planar surface adjacent the phase change material and parallel to the substrate.

16. The device of claim 15, wherein the second electrode includes a cross-section having a lateral dimension parallel to the substrate and substantially equal to the lateral dimension of the phase change material.

17. The device of claim 15, wherein the phase change material comprises an alloy including tellurium, antimony, and germanium.

18. The device of claim 17, wherein the ratio of tellurium atoms to antimony atoms in the alloy is substantially equal to 5:2.

19. The device of claim 17, wherein the ratio of tellurium atoms to germanium atoms in the alloy is substantially equal to 5:2.

20. The device of claim 15, wherein the first electrode includes an additional dimension perpendicular to the substrate and substantially equal to 500 Angstroms.

21. The device of claim 15, wherein the phase change material includes an additional dimension perpendicular to the substrate and substantially equal to 1000 Angstroms.

22. The device of claim 15, comprising a second electrode disposed over the phase change material, the second electrode including a dimension perpendicular to the substrate and substantially equal to 600 Angstroms.

23. An electronic device comprising:
an array of chalcogenide memory cells;
a conductive substrate comprising an X-Y grid of electrodes on which the array of chalcogenide memory cells are formed;
each memory cell comprising; a) a lower electrode formed in a window formed in a layer of insulating material, wherein the lower electrode material of the chalcogenide memory cells is selected from the group consisting of Ti, TiN, and $TiC_xN_y$, the window defining a dimension of the memory cell lower electrode, the dimension being sublithographic; b) a chalcogenide material formed over the lower electrode; and c) an upper electrode formed over the chalcogenide material and an insulator formed over the memory cell;
the upper electrode in electrical contact with an upper X-Y grid of conductors;
diodes in series with the chalcogenide memory cells;
wherein the upper and lower X-Y grid of conductors are configured for addressing the memory cells; and
wherein the diodes provide for read/write operations of the memory cells.

24. The electronic device of claim 23, wherein the chalcogenide material is selected from the group consisting of Se, Te, Ge, Sb and compositions of at least two of Se, Te, Ge, and Sb.

25. The electronic device of claim 24, wherein the chalcogenide material includes Te, Ge and Sb in the ratio $Te_a Ge_b Sb_{100-(a+b)}$ where the subscripts are in atomic percentages which total 100% of the constituent elements and a is less than about 70 and b is the range from greater than about 15 to less than about 50.

26. The electronic device of claim 25, wherein a is in the range of about 40 to about 60 and b is in the range of about 17 to about 44.

* * * * *

UNITED STATES PATENT AND TRADEMARK OFFICE
CERTIFICATE OF CORRECTION

| | | |
|---|---|---|
| PATENT NO. | : 8,264,061 B2 | Page 1 of 1 |
| APPLICATION NO. | : 12/917920 | |
| DATED | : September 11, 2012 | |
| INVENTOR(S) | : Russell C. Zahorik | |

It is certified that error appears in the above-identified patent and that said Letters Patent is hereby corrected as shown below:

In the Claims

Column 14, line 4, "device of claim 5" should read --device of claim 7--.

Signed and Sealed this
Twentieth Day of May, 2014

Michelle K. Lee
*Deputy Director of the United States Patent and Trademark Office*